US012666835B2

(12) United States Patent
Lee et al.

(10) Patent No.: US 12,666,835 B2
(45) Date of Patent: Jun. 23, 2026

(54) DISPLAY APPARATUS

(71) Applicant: LG Display Co., Ltd., Seoul (KR)

(72) Inventors: YoungWook Lee, Gyeonggi-do (KR);
GiSang Hong, Gyeonggi-do (KR);
JongWon Lee, Gyeonggi-do (KR);
Jungmin Kim, Gyeonggi-do (KR);
Hoseung Lee, Gyeonggi-do (KR)

(73) Assignee: LG Display Co., Ltd., Seoul (KR)

( * ) Notice: Subject to any disclaimer, the term of this
patent is extended or adjusted under 35
U.S.C. 154(b) by 355 days.

(21) Appl. No.: 18/210,399

(22) Filed: Jun. 15, 2023

(65) Prior Publication Data

US 2023/0413634 A1 Dec. 21, 2023

(30) Foreign Application Priority Data

Jun. 20, 2022 (KR) ........................ 10-2022-0074874

(51) Int. Cl.
*H10K 59/35* (2023.01)
*H10K 59/38* (2023.01)
*H10K 59/80* (2023.01)
(52) U.S. Cl.
CPC ........... *H10K 59/351* (2023.02); *H10K 59/38*
(2023.02); *H10K 59/80515* (2023.02); *H10K
59/878* (2023.02)
(58) Field of Classification Search
CPC ........... H10K 59/351; H10K 59/80515; H10K
59/38; H10K 59/878
USPC ........................................................ 313/500
See application file for complete search history.

(56) References Cited

U.S. PATENT DOCUMENTS

| | | | |
|---|---|---|---|
| 10,516,131 B2 | 12/2019 | Koike et al. | |
| 2005/0077819 A1 | 4/2005 | Park | |
| 2013/0001603 A1 | 1/2013 | Lim et al. | |
| 2014/0061605 A1 | 3/2014 | Kim et al. | |
| 2019/0096976 A1* | 3/2019 | Jang ..................... | H10H 20/855 |
| 2019/0131581 A1 | 5/2019 | Choi et al. | |
| 2020/0028111 A1* | 1/2020 | Moon ................... | H10K 50/13 |
| 2021/0210515 A1* | 7/2021 | Zhang ................. | H10K 50/844 |

FOREIGN PATENT DOCUMENTS

| | | |
|---|---|---|
| KR | 10-2005-0034426 | 4/2005 |
| KR | 10-2013-0007421 A | 1/2013 |
| KR | 10-2014-0030842 A | 3/2014 |
| KR | 10-2019-0048834 A | 5/2019 |

(Continued)

OTHER PUBLICATIONS

Bibliographic data: KR20230173983 (A) (Year: 2002).*
Office Action dated Dec. 31, 2025, issued in corresponding Korean
Patent Application No. 10-2022-0074874.

*Primary Examiner* — James R Greece
*Assistant Examiner* — Hana S Featherly
(74) *Attorney, Agent, or Firm* — Morgan, Lewis &
Bockius LLP

(57) ABSTRACT

A display apparatus may enhance light extraction efficiency,
prevent the damage of an emission layer, and prevent the
delay of an image signal. The display apparatus may include
a substrate having a plurality of subpixels defined thereon;
a planarization layer on the substrate; a protrusion portion on
the planarization layer, the protrusion portion including an
upper surface and a lateral surface; and a reflection portion
on the lateral surface of the protrusion portion.

22 Claims, 13 Drawing Sheets

(56)            References Cited

FOREIGN PATENT DOCUMENTS

| | | | |
|---|---|---|---|
| KR | 10-2019-0081863 | A | 7/2019 |
| WO | 2017/094760 | A1 | 6/2017 |
| WO | WO-2018209977 | A1 * | 11/2018 ............. H10D 86/60 |

* cited by examiner

DISPLAY APPARATUS

CROSS-REFERENCE TO RELATED APPLICATIONS

This application claims the benefit of the Korean Patent Application No. 10-2022-0074874 filed on Jun. 20, 2022, which is hereby incorporated by reference as if fully set forth herein.

BACKGROUND

Technical Field

The present disclosure relates to a display apparatus for displaying an image.

Discussion of the Related Art

With advancement of information-oriented society, various requirements for display apparatuses for displaying an image are increasing. Therefore, various display apparatuses, such as liquid crystal display (LCD) apparatuses, plasma display panels (PDPs), organic light emitting display apparatuses, quantum-dot light emitting display (QLED) apparatuses, and electroluminescent display (ELD) apparatuses are being used recently. Among display apparatuses, organic light emitting display apparatuses, which are self-emitting display apparatuses, are better in contrast ratio and viewing angle than LCD apparatuses, and do not need a separate backlight, and thus, may be implemented to be lightweight and thin and to have low power consumption.

Recently, organic light emitting display apparatuses of a bottom emission type where reflective electrodes are disposed along grooves after the grooves are formed at boundary portions between subpixels are being developed for increasing the light extraction efficiency of light emitted from an emission layer of each of a plurality of subpixels. In the organic light emitting display apparatuses of the bottom emission type, because a color filter is disposed under an emission layer when a depth of a groove is very deep, out-gassing may occur as the color filter is exposed at the groove, and due to this, the emission layer may be damaged. Also, a reflection electrode disposed in the groove is disposed close to a lower line which transfers a signal to the emission layer, and thus, a capacitor occurs between the reflection electrode and the lower line, causing a problem where an image signal is delayed.

SUMMARY

Accordingly, embodiments of the present disclosure are directed to a display apparatus that substantially obviates one or more problems due to limitations and disadvantages of the related art.

An aspect of the present disclosure is to provide a display apparatus that may enhance light extraction efficiency, prevent the damage of an emission layer, and prevent the delay of an image signal.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus display apparatus comprises a substrate having a plurality of subpixels defined thereon; a planarization layer on the substrate; a protrusion portion on the planarization layer, the protrusion portion including an upper surface and a lateral surface; and a reflection portion on the lateral surface of the protrusion portion.

In another aspect, a display apparatus comprises a substrate having a plurality of subpixels defined thereon; a planarization layer on the substrate; a protrusion portion on the planarization layer, the protrusion portion including an upper surface and a lateral surface; an anode electrode on the upper surface and the lateral surface of the protrusion portion; a reflection portion on the anode electrode; and an insulation layer between the reflection portion and the anode electrode on the lateral surface of the protrusion portion.

In the present disclosure, a protrusion portion may be provided on a planarization layer of each of a plurality of subpixels, and thus, a reflection portion disposed on a lateral surface (or a slope surface) of the protrusion portion may reflect light, traveling to a lateral surface of each subpixel, in a forward direction, thereby enhancing forward light efficiency.

Moreover, in the present disclosure, because the protrusion portion is provided on the planarization layer of each of the plurality of subpixels, a groove (or an engraved pattern) may not be formed in the planarization layer, and thus, a color filter disposed under the planarization layer may not be exposed at the groove (or the engraved pattern). Accordingly, in the present disclosure, the damage of an emission layer caused by out-gassing of the color filter may be prevented.

Moreover, in the present disclosure, because the groove (or the engraved pattern) is not formed in the planarization layer, the reflection portion provided on the planarization layer may not be disposed close to a line which transfers a signal. Accordingly, in the present disclosure, a capacitor may not occur between the reflection portion and the line, an image signal may not be delayed.

Moreover, in the present disclosure, the protrusion portion may be included in each subpixel and a structure may be provided where the reflection portion is disposed on a slope surface of the protrusion portion, and thus, unlike general display apparatuses, the occurrence of color mixture between subpixels may be prevented even without a groove being formed in a bank. Accordingly, in the present disclosure, a color mixture prevention structure of a general display apparatus of a bottom emission type may be deleted, and thus, the degree of freedom in design margin may be more enhanced than the general display apparatus of the bottom emission type, thereby increasing reliability and a yield rate.

Moreover, in the present disclosure, the color mixture prevention structure of the general display apparatus of the bottom emission type may be deleted, and thus, an area (or an opening ratio) of an emission region may more increase than the general display apparatus of the bottom emission type, thereby more enhancing light efficiency.

Moreover, in the present disclosure, an area of the reflection portion disposed on the slope surface of the protrusion portion may increase by adjusting a thickness of the protrusion portion and/or an angle of the slope surface of the protrusion portion. Accordingly, in the present disclosure, because a depth of the groove is limited, light extraction efficiency may be more enhanced than the general display apparatus where a reflection area is limited.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION

Figure 1:
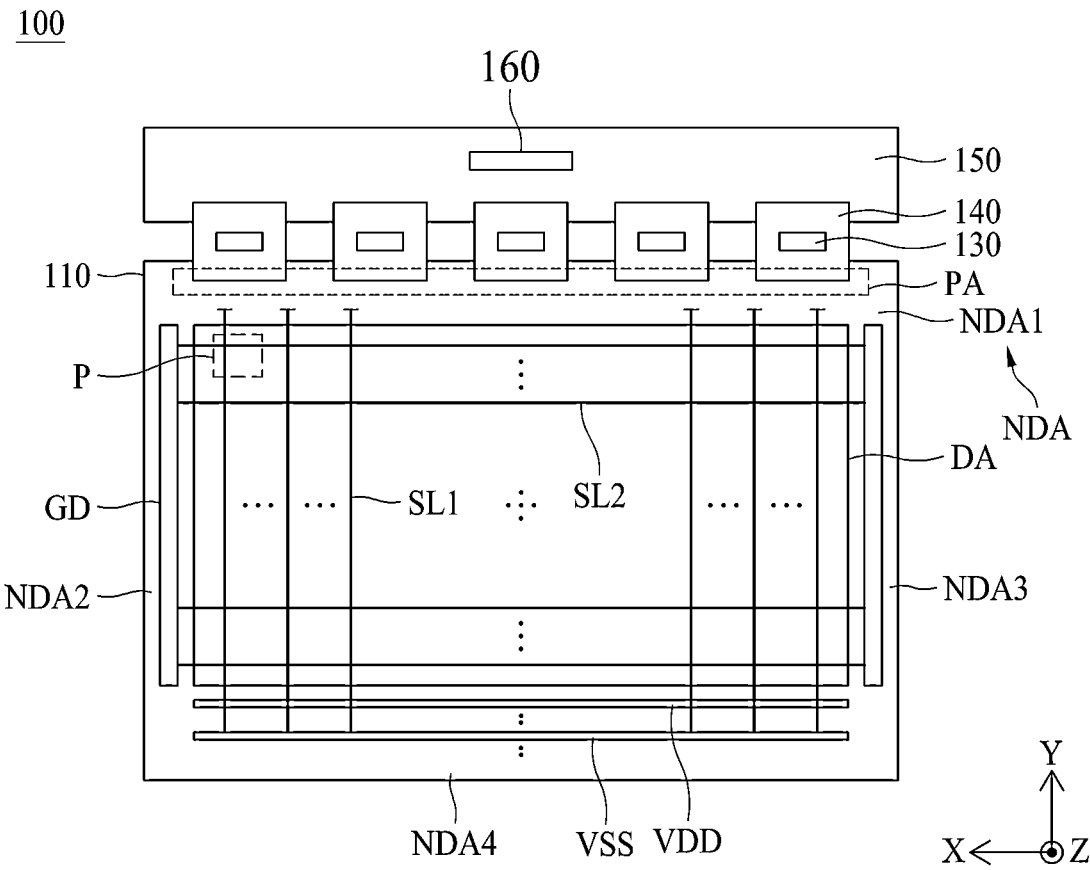
FIG. 1 is a schematic plan view of a display apparatus according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only" is used. The terms of a singular form may include plural forms unless referred to the contrary. In construing an element, the element is construed as including an error range although there is no explicit description. In describing a position relationship, for example, when a position relation between two parts is described as "on~," "over~," "under~," and "next~," one or more other parts may be disposed between the two parts unless "just" or "direct" is used. In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and may have broader directionality within the range that elements of the present disclosure may act functionally. The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the embodiments of the present disclosure will be described in detail with reference to the accompanying drawings.

Figure 2:
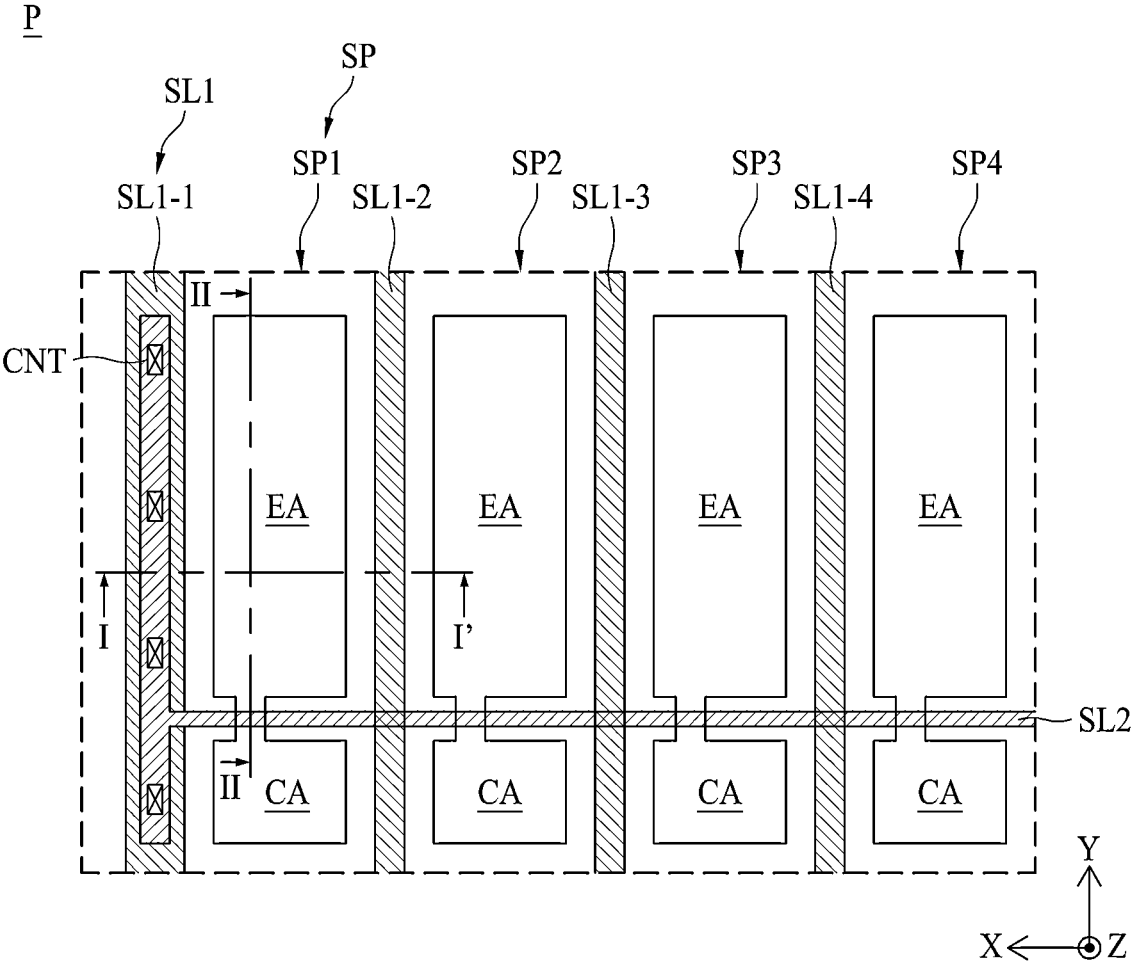
FIG. 2 is a diagram illustrating a plane structure of a pixel illustrated in FIG. 1.
Figure 3:
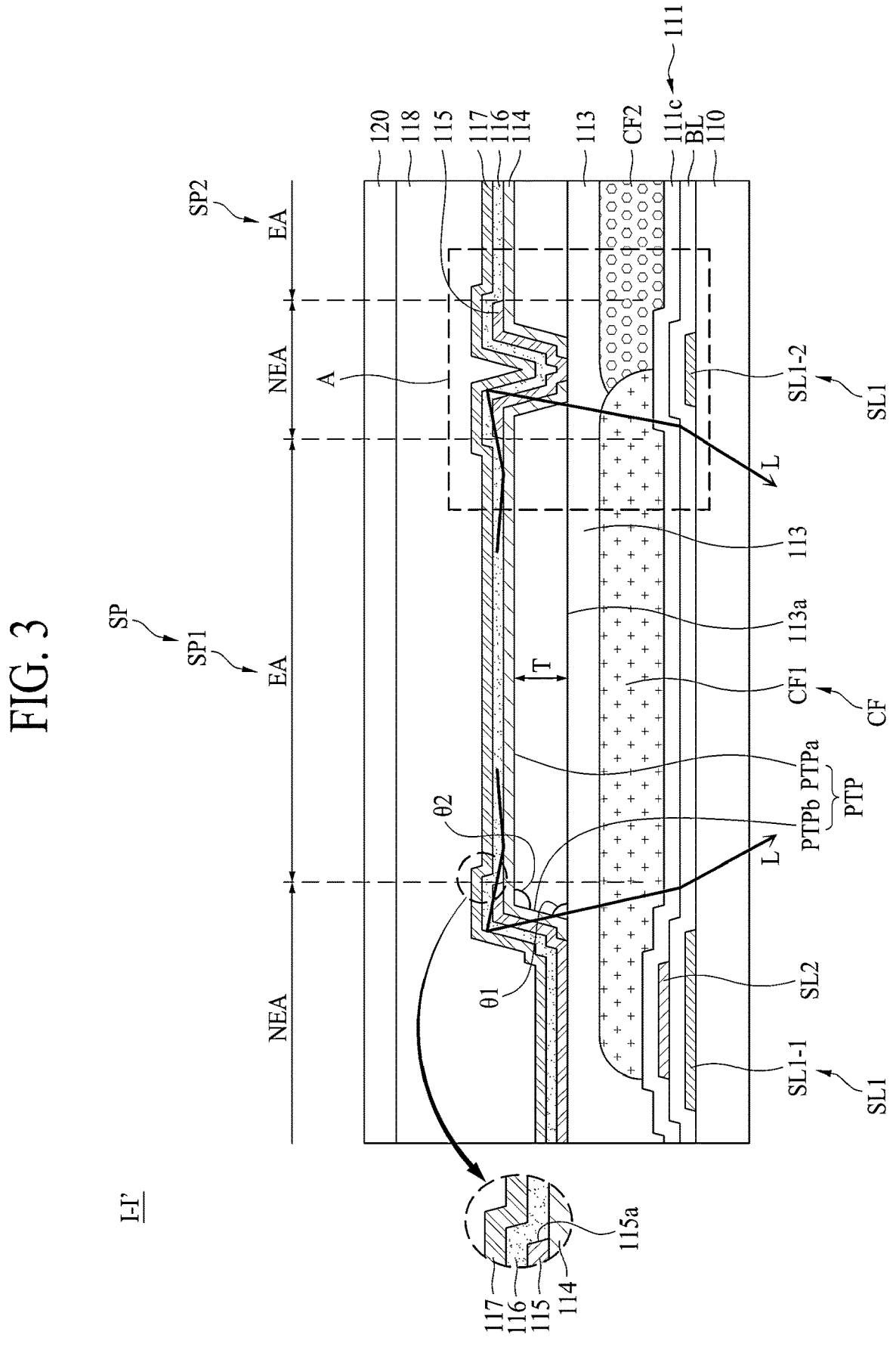
FIG. 3 is a schematic cross-sectional view taken along line I-I' illustrated in FIG. 2.
Figure 4:
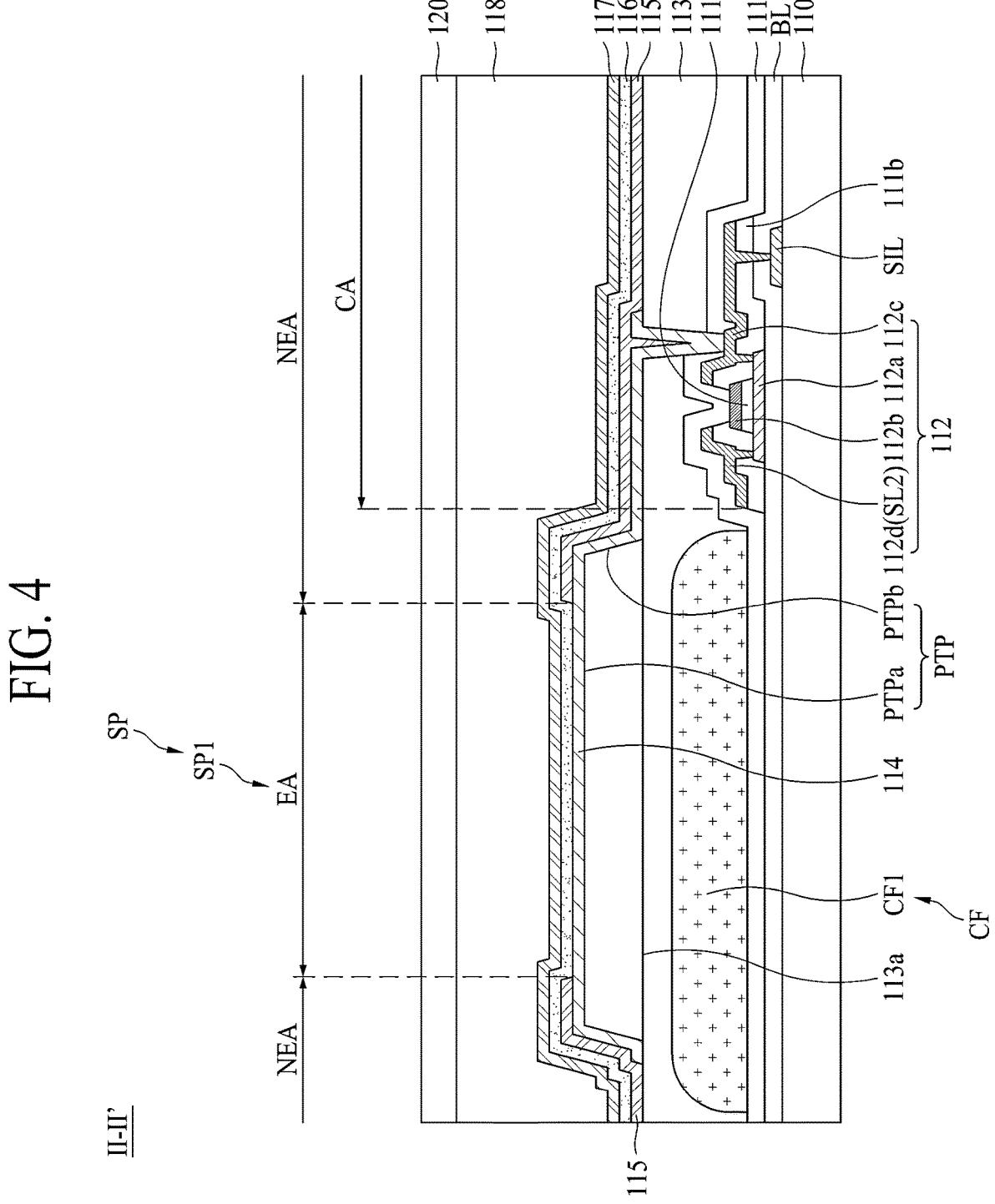
FIG. 4 is a schematic cross-sectional view taken along line II-II' illustrated in FIG. 2.
Figure 5:
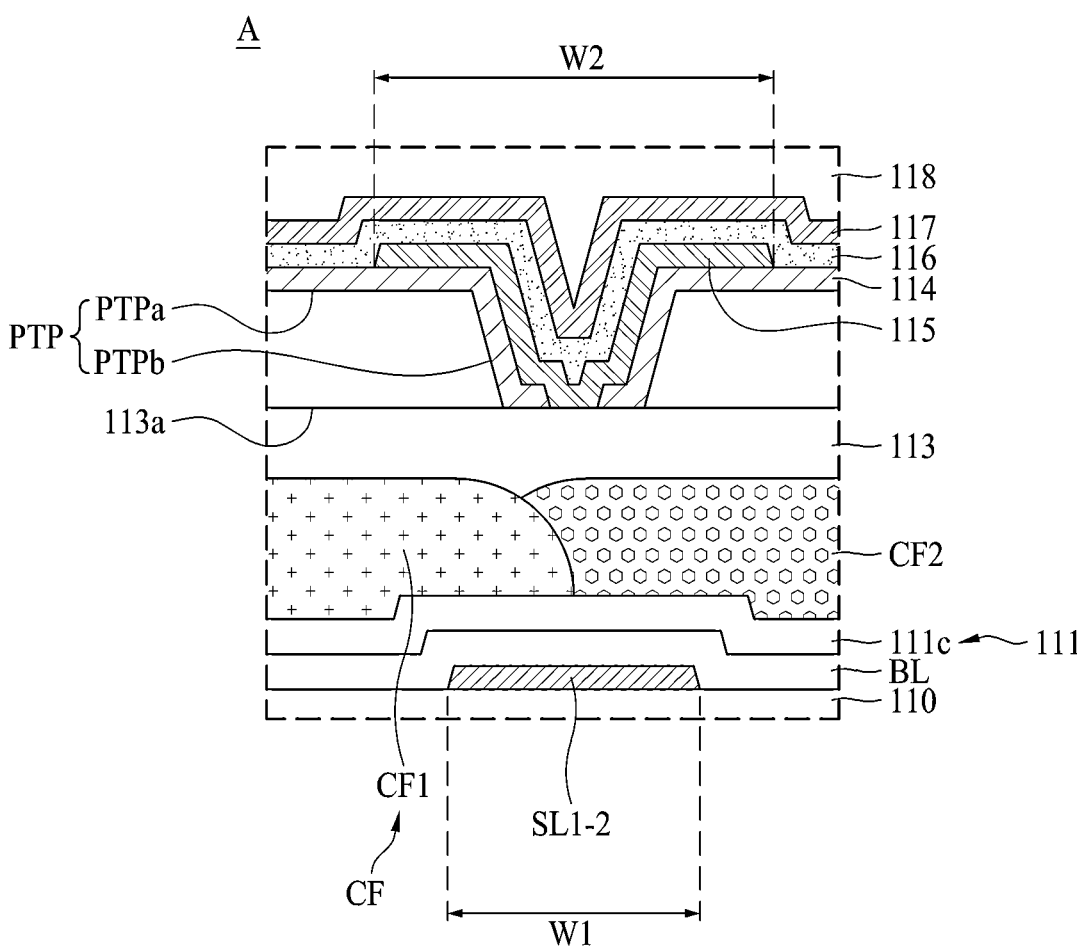
FIG. 5 is an enlarged cross-sectional view of a region A illustrated in FIG. 3.

FIG. 1 is a schematic plan view of a display apparatus 100 according to an embodiment of the present disclosure. FIG. 2 is a diagram illustrating a plane structure of a pixel illustrated in FIG. 1. FIG. 3 is a schematic cross-sectional view taken along line I-I' illustrated in FIG. 2. FIG. 4 is a schematic cross-sectional view taken along line II-II' illustrated in FIG. 2. FIG. 5 is an enlarged cross-sectional view of a region A illustrated in FIG. 3.

Hereinafter, an X axis may represent a direction parallel to a gate line, a Y axis may represent a direction parallel to a data line, and a Z axis may represent a thickness direction of the display apparatus 100.

The following description will be based on that the display apparatus 100 according to one embodiment of the present disclosure is an organic light emitting display apparatus, but is not limited thereto. For example, the display apparatus according to one embodiment of the present disclosure may be implemented as any one of a liquid crystal display apparatus, a field emission display apparatus, a quantum dot lighting emitting diode apparatus, and an electrophoretic display apparatus as well as the organic light emitting display apparatus.

With reference to FIGS. 1 to 5, the display apparatus 100 according to an embodiment of the present disclosure may include a substrate 110 including a plurality of subpixels SP, a planarization layer 113 on the substrate 110, a protrusion portion PTP which is on the planarization layer 113 and includes an upper surface PTPa and a lateral surface PTPb, and a reflection portion 117 which is on the lateral surface PTPb of the protrusion portion PTP. Each of the plurality of subpixels SP may emit light when a voltage is applied thereto.

An opposite substrate 120 (illustrated in FIG. 3) may be disposed on the substrate 110 to face the substrate 110. The planarization layer 113 may be disposed between the substrate 110 and the opposite substrate 120. The protrusion portion PTP may be formed to protrude toward the opposite substrate 120 from an upper surface 113a of the planarization layer 113. Accordingly, as in the example of FIG. 3, the protrusion portion PTP may include the upper surface PTPa and the lateral surface PTPb.

The upper surface PTPa of the protrusion portion PTP and the lateral surface PTPb of the protrusion portion PTP may be provided to form an obtuse angle. Therefore, a width of the upper surface PTPa of the protrusion portion PTP may be formed to be narrower than that of a lower surface of the protrusion portion PTP. Also, an angle between the lateral surface PTPb of the protrusion portion PTP and the upper surface 113a of the planarization layer 113 contacting the protrusion portion PTP may form an angle (or an acute angle) of less than 90 degrees. A reflection portion 117 may be provided on the lateral surface PTPb of the protrusion portion PTP having an acute angle. Because the lateral surface PTPb of the protrusion portion PTP is provided at an acute angle, the lateral surface PTPb of the protrusion portion PTP may be referred to as a slope portion.

In the display apparatus 100 according to an embodiment of the present disclosure, the reflection portion 117 may be provided on the lateral surface PTPb of the protrusion portion PTP having an acute angle, and thus, may reflect light (or lateral light), which is emitted from each of the plurality of subpixels SP and travels to a lateral surface of each subpixel SP, to a front surface. Accordingly, the display apparatus 100 according to an embodiment of the present disclosure may be enhanced in forward light extraction efficiency. Here, the front surface may denote a surface through which light is output and may denote a lower surface of the substrate 110 with respect to FIG. 3. For example, the display apparatus 100 according to an embodiment of the present disclosure may enhance forward light efficiency in a bottom emission type.

In a general display apparatus of the bottom emission type, a groove may be formed by patterning (or etching) a planarization layer, and then, a reflection electrode may be disposed along a groove, thereby increasing light efficiency. In the bottom emission type, a color filter may be disposed under an emission layer, and thus, when a depth of the groove is very deep, out-gassing may occur as the color filter is exposed at the groove. Therefore, in the general display apparatus of the bottom emission type, an emission layer may be damaged due to the out-gassing of the color filter, and due to this, reliability and/or a yield rate may be low, whereby there may inevitably be a limitation in deeply digging the groove. Also, in the general display apparatus of the bottom emission type, the reflection electrode disposed in the groove may be disposed close to a lower line which transfers a signal to the emission layer, and thus, a capacitor may occur between the reflection electrode and the lower line, causing a problem where an image signal is delayed.

On the other hand, in the display apparatus 100 according to an embodiment of the present disclosure, the protrusion portion PTP protruding toward the opposite substrate 120 may be provided on the planarization layer 113, and thus, the planarization layer 113 may not be patterned (or etched), thereby preventing the damage of the emission layer caused by out-gassing of the color filter and enhancing reliability and/or a yield rate. Also, in the display apparatus 100 according to an embodiment of the present disclosure, the protrusion portion PTP protruding toward the opposite substrate 120 may be provided on the planarization layer 113, and thus, a distance between the reflection portion 117 and the lower line may more increase than the general display apparatus of the bottom emission type where a groove is deeply dug, whereby a problem where an image signal is delayed may not occur because a capacitor does not occur.

Hereinafter, a total structure of the display apparatus 100 according to the present disclosure will be described.

As shown in FIGS. 1 to 5, the display apparatus 100 according to an embodiment of the present disclosure may include a display panel including a gate driver GD, a source driving integrated circuit (IC) 130, a flexible film 140, a circuit board 150, and a timing controller 160. The display panel may include the substrate 110 and the opposite substrate 120 (illustrated in FIG. 3), which are bonded to each other.

The substrate 110 may include a thin film transistor (TFT) and may be a transistor array substrate, a lower substrate, a base substrate, or a first substrate. The substrate 110 may be a transparent glass substrate or a transparent plastic substrate. Hereinafter, the substrate 110 may be defined as a first substrate.

The opposite substrate 120 may be opposite-bonded to the first substrate 110 using an adhesive member. For example, the opposite substrate 120 may have a size which is less than that of the first substrate 110 and may be opposite-bonded to a portion, other than a pad portion PA, of the first substrate 110. The opposite substrate 120 may be an upper substrate, a second substrate, or an encapsulation substrate. Hereinafter, the opposite substrate 120 may be defined as a second substrate.

The gate driver GD may supply gate signals to gate lines, based on a gate control signal input from the timing controller 160. The source driving IC 130 may be mounted on the flexible film 140 using a chip on film (COF) type or a chip on panel (COP) type.

Pads such as power pads and data pads may be formed in a non-display area of the display panel. Lines connecting the pads with the source driving IC 130 and lines connecting the pads with lines of the circuit board 150 may be formed in the flexible film 140. The flexible film 140 may be attached on the pads using an anisotropic conductive film, and thus, the pads may be connected with the lines of the flexible film 140.

As illustrated in FIGS. 1 to 5, the first substrate 110 according to an example may include a display area DA and a non-display area NDA.

The display area DA is an area where an image is displayed, and may be a pixel array area, an active area, a pixel array unit, a display unit or a screen. For example, the display area DA may be disposed at a central portion of the display panel.

The display area DA according to an example may include gate lines, data lines, pixel driving power lines, and a plurality of pixels P. Each of the plurality of pixels P may include a plurality of subpixels SP that may be defined by the gate lines and the data lines. Each of the plurality of subpixels SP may include an emission region EA and a circuit region CA adjacent to the emission region EA.

The emission region EA according to an embodiment may be defined as a minimum-unit region which actually emits light. The circuit region CA according to an embodiment may be defined as a region where a TFT for allowing the emission region EA to emit light is provided. As illustrated in FIG. 2, the circuit region CA may be disposed adjacent to one side of the emission region EA. For example, the emission region EA and the circuit region CA may be arranged in a first direction (a Y-axis direction), and thus, may be arranged in parallel with a first line SL1. For example, the first line SL1 may be one of a pixel power line, a common power line, a reference line, and a data line.

At least four subpixels, which are disposed adjacent to one another to emit lights of different colors, of the plurality of subpixels SP may configure one pixel P (or a unit pixel). The one pixel P may include a red subpixel, a green subpixel, a blue subpixel, and a white subpixel, but embodiments of the present disclosure are not limited thereto. For example, the red subpixel may be a first subpixel SP1, the green subpixel may be a second subpixel SP2, the blue subpixel may be a third subpixel SP3, and the white subpixel may be a fourth subpixel SP4.

According to another embodiment, the one pixel P may be configured with three subpixels SP which are disposed adjacent to one another to emit lights of different colors. The one pixel P may include a red subpixel, a green subpixel, and a blue subpixel.

Each of the plurality of subpixels SP may include a thin film transistor, and a light emitting device connected to the thin film transistor. The subpixel may include a light emitting layer (or organic light emitting layer) interposed between the anode electrode and the reflector.

The light emitting element layers disposed in the respective subpixels SP may individually emit light of their respective colors different from one another or commonly emit white light. According to one example, when the light emitting layers of the plurality of subpixels commonly emit white light, each of the red subpixel, the green subpixel and the blue subpixel may include a color filter CF (or wavelength conversion member CF) for converting white light into light of its respective different color. In this case, the white subpixel according to one example may not include a color filter. In the display apparatus 100 according to an embodiment of the present disclosure, a region where a red color filter CF1 is provided may be the red subpixel SP1, a region where a green color filter CF2 is provided may be the green subpixel SP2, a region where a blue color filter is provided may be the blue subpixel SP3, and a region where a color filter is not provided may be the white subpixel SP4.

Each of the subpixels SP supplies a predetermined current to the organic light-emitting element in accordance with a data voltage of the data line when a gate signal is input from the gate line using the thin film transistor. For this reason, the light emitting layer of each of the subpixels may emit light with a predetermined brightness in accordance with a predetermined current.

The plurality of subpixels SP emitting lights of different colors may include four subpixels which are arranged apart from one another to have the same shape and size as in FIG. 2, and for example, may include the first subpixel SP1, the second subpixel SP2, the third subpixel SP3, and the fourth subpixel SP4. However, embodiments of the present disclosure are not limited thereto, and a shape and/or a size of at least one of the first to fourth subpixels SP1 to SP4 may be differently provided. A structure of each of the subpixels SP will be described below in detail with reference to FIGS. 3 and 4.

The display area DA, as illustrated in FIG. 2, may include the plurality of subpixels SP, and the plurality of subpixels SP may include the emission region EA and the circuit region CA. Also, the display area DA may include a first line SL1 adjacent to each of the plurality of subpixels SP and a second line SL2 which is connected with the first line SL1 through a contact hole CNT and is arranged in a direction (for example, a second direction (an X-axis direction) which differs from the first line SL1. The first line SL1, as in FIG. 2, may be arranged in the first direction (the X-axis direction). The first line SL1 and the second line SL2 according to an embodiment may receive power and/or an image signal from at least one of the gate driver GD and the pad portion PA and may transfer the power and/or the image signal to the plurality of subpixels SP of the display area DA.

For example, the first line SL1 may include a plurality of first sub lines SL1-1, SL1-2, SL1-3, SL1-4. Each of the plurality of first sub lines SL1-1 to SL1-4 may be one of the pixel power line, the common power line, the reference line, and the data line. The plurality of first sub lines SL1-1 to SL1-4 may denote a signal line group connected with one subpixel SP.

The second line SL2 may be electrically connected with at least one of a plurality of first sub lines and may be connected with each of the subpixels SP. For example, as in FIG. 3, the second line SL2 may be connected with a TFT 112 of the subpixel SP. Therefore, each of the plurality of subpixels SP may receive the power and/or the image signal through the first line SL1 and the second line SL2 to display an image having the sense of unity. The second line SL2 according to an embodiment may be provided in plurality. In this case, the second line SL2 may include a plurality of sub lines connected with the first line SL1 and a gate line connected with the gate driver GD.

The non-display area NDA may be an area which does not display an image and may be a peripheral circuit region, a signal supply region, an inactive region, or a bezel region. The non-display area NDA may be provided at a periphery of the display area DA. For example, the non-display area NDA may be disposed to surround the display area DA.

The display apparatus 100 according to an embodiment of the present disclosure, the pad portion PA may be disposed in the non-display area NDA. The pad portion PA may supply power and/or a signal, which allow(s) the pixel P included in the display area DA to display an image. The non-display area NDA may include a first non-display area NDA1, a second non-display area NDA2, a third non-display area NDA3, and a fourth non-display area NDA4. A region where the pad portion PA is provided may be the first non-display area NDA1.

The gate driver GD may supply gate signals to gate lines, based on the gate control signal input from the timing controller 160. The gate driver GD may be provided as a gate driver in panel (GIP) type in the non-display area NDA outside one side of the display area DA of the display panel or both sides of the display area DA as in FIG. 1. Alternatively, the gate driver GD may be manufactured as a driving IC and may be mounted on a flexible film, and moreover, may be attached on the non-display area NDA outside one side or both sides of the display area DA of the display panel in a tape automated bonding (TAB) type.

A plurality of gate drivers GD may be divisionally arranged at a left side of the display area DA (e.g., the second non-display area NDA2) and a right side of the display area DA (e.g., the third non-display area NDA3) with respect to FIG. 1. According to an embodiment, the plurality of gate drivers GD may be connected with a gate line included in the second line SL2, so as to supply a signal for driving each of the plurality of pixels P.

A plurality of first lines SL1 may extend in the first direction (the Y-axis direction). A plurality of second lines SL2 may intersect with the plurality of first lines SL1. The plurality of first lines SL1 may include a pixel power line and at least one data line for supplying a data voltage to the pixel P. Each of the plurality of first lines SL1 may be connected with at least one of a plurality of pads, a pixel power shorting bar VDD, and a common power shorting bar VSS. The pixel power shorting bar VDD and the common power shorting bar VSS may be disposed in the fourth non-display area NDA4 which is disposed to face the pad portion PA, with respect to the display area DA.

The plurality of subpixels SP may be provided to overlap at least one of the first line SL1 and the second line SL and may emit certain light to display an image. The emission region EA may correspond to a region, emitting light, of the subpixel SP.

For example, the first subpixel SP1 may include an emission region EA which emits red light, the second subpixel SP2 may include an emission region EA which emits green light, the third subpixel SP3 may include an emission region EA which emits blue light, and the fourth subpixel SP4 may include an emission region EA which emits white light, but embodiments of the present disclosure are not limited thereto. Each of the pixels P may further include a subpixel which emits light having a color other than red, green, blue, and white. Also, the arrangement order of the subpixels SP1 to SP4 may be variously modified.

The display apparatus 100 according to an embodiment of the present disclosure may further include a first layer BL, a circuit element layer 111, a TFT 112, an anode electrode 114, an insulation layer 115, an organic emission layer 116, and a plurality of color filters CF.

Each of the subpixels SP according to an embodiment may include an inorganic layer 111 which is provided on an upper surface of the first layer BL and includes a gate insulation layer 111a, an interlayer insulation layer 111b, and a second layer 111c, a planarization layer 113 provided on the inorganic layer 111, an anode electrode 114 provided on the planarization layer 113, an insulation layer 115 covering an edge of the anode electrode 114, an organic emission layer 116 on the anode electrode 114 and the insulation layer 115, a reflection portion 117 on the organic emission layer 116, and an encapsulation layer 118 on the reflection portion 117.

The TFT 112 for driving the subpixel SP may be disposed at the inorganic layer 111. The inorganic layer 111 may be referred to as a circuit element layer. The first layer BL may be included in the inorganic layer 111 along with the gate insulation layer 111a, the interlayer insulation layer 111b, and the second layer 111c. The anode electrode 114, the organic emission layer 116, and the reflection portion 117 may be included in the light emitting device.

With further reference to FIGS. 3 and 4, the first layer BL may be formed between the first substrate 110 and the gate insulating layer 111a to protect the thin film transistor 112. The first layer BL may be disposed entirely on one surface (or front surface) of the first substrate 110. The first layer BL may serve to prevent a material contained in the first substrate 110 from being diffused into a transistor layer during a high temperature process of the manufacturing process of the thin film transistor. The first layer may be expressed in terms of a buffer layer. Optionally, the first layer BL may be omitted as the case may be.

The thin film transistor (or a drive transistor) 112 according to an example may include an active layer 112a, a gate electrode 112b, a source electrode 112c, and a drain electrode 112d.

The active layer 112a may include a channel area, a drain area and a source area, which are formed in a thin film transistor area of a circuit area of the subpixel SP. The drain area and the source area may be spaced apart from each other with the channel area interposed therebetween. The active layer 112a may be formed of a semiconductor material based on any one of amorphous silicon, polycrystalline silicon, oxide and organic material.

The gate insulating layer 111a may be formed on the channel area of the active layer 112a. As an example, the gate insulating layer 111a may be formed in an island shape only on the channel area of the active layer 112a, or may be formed on an entire front surface of the first substrate 110 or the first layer BL, which includes the active layer 112a.

The gate electrode 112b may be formed on the gate insulating layer 111a to overlap the channel area of the active layer 112a. The interlayer insulation layer 111b may be formed to partially overlap the gate electrode 112b and a drain region and a source region of the active layer 112a. The interlayer insulation layer 111b, as in FIG. 4, may be patterned between the drain electrode 112d and the gate electrode 112b and drain region of the active layer 112a and may be arranged in an island shape, and moreover, may be patterned between the source electrode 112c and the gate electrode 112b and source region of the active layer 112a and may be arranged in an island shape. However, embodiments of the present disclosure are not limited thereto, and the interlayer insulation layer 111b may be provided in a whole emission region which emits light in the subpixel SP and a circuit region.

The source electrode 112c may be electrically connected with the source region of the active layer 112a through a source contact hole provided in the interlayer insulation layer 111b overlapping the source region of the active layer 112a. The source electrode 112c may be connected with a line SIL disposed between the first substrate 110 and the first layer BL. Accordingly, the source electrode 112c may receive a driving voltage or an image signal from the line SIL and may allow the subpixel SP to emit light.

The drain electrode 112d may be electrically connected with the drain region of the active layer 112a through a drain contact hole provided in the interlayer insulation layer 111b overlapping the drain region of the active layer 112a. The drain electrode 112d may be connected with the second line SIL2 electrically connected with the first line SL1. The second line SL2 may be formed together in forming the drain electrode 112d. Therefore, the second line SL2 may be disposed on the same layer as the drain electrode 112d. However, embodiments of the present disclosure are not limited thereto, and the second line SL2 may be formed together in forming the gate electrode 112b and may be disposed on the same layer as the gate electrode 112b.

The drain electrode 112d and the source electrode 112c may be made of the same metal material. For example, each of the drain electrode 112d and the source electrode 112c may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Because each of the first and second switching thin film transistors is provided on the circuit area of the subpixel SP to have the same structure as that of the thin film transistor 112, its description will be omitted. The capacitor may be provided in an overlap area between the gate electrode 112*b* and the source electrode 112*c* of the thin film transistor 112, which overlap each other with the interlayer insulating layer 111*b* interposed therebetween.

Additionally, to prevent a threshold voltage of the thin film transistor provided in a pixel area from being shifted by light, the display panel or the first substrate 110 may further include a light shielding layer (not shown) provided below the active layer 112*a* of at least one of the thin film transistor 112, the first switching thin film transistor or the second switching thin film transistor. The light shielding layer may be disposed between the first substrate 110 and the active layer 112*a* to shield light incident on the active layer 112*a* through the first substrate 110, thereby minimizing a change in the threshold voltage of the transistor due to external light.

The second layer 111*c* may be provided on the first substrate 110 to cover the pixel area. The second layer 111*c* covers the drain electrode 112*d* and the source electrode 112*c* of the thin film transistor 112 and the first layer BL. The second layer 111*c* may be entirely formed in the circuit area and the light emission area. For example, the second layer 111*c* may be expressed as a passivation layer. The second layer 111*c* may be omitted.

The planarization layer 113 may be formed on the first substrate 110 to cover the second layer 111*c* and the color filter CF. When the second layer 111*c* is omitted, the planarization layer 113 may be provided on the first substrate 110 to cover the circuit area. The planarization layer 113 may be formed entirely in the circuit area and the light emission area. In addition, the planarization layer 113 may be formed on the other non-display area NDA except the pad portion PA in the non-display area NDA and the entire display area DA. For example, the planarization layer 113 may include an extension portion (or enlarged portion) extended or enlarged from the display area DA to the other non-display area NDA except the pad portion PA. Therefore, the planarization layer 113 may have a size relatively wider than that of the display area DA.

The planarization layer 113 according to an example may be formed to be relatively thick, and thus may provide a flat surface on the display area DA and the non-display area NDA. For example, the planarization layer 113 may be made of an organic material such as photo acryl, benzocy-clobutene, polyimide, and fluorine resin.

The plurality of color filters CF according to an embodiment may be provided between the first substrate 110 and the planarization layer 113. The plurality of color filters CF may include a red color filter (or a first color filter) CF1 which converts white light, emitted from the organic emission layer 116, into red light, a green color filter (or a second color filter) CF2 which converts the white light into green light, and a blue color filter which converts the white light into blue light. The fourth subpixel which is the white subpixel may emit the white light using the organic emission layer 116, and thus, may not include a color filter.

In the display apparatus 100 according to an embodiment of the present disclosure, a plurality of color filters having different colors may partially overlap each other at a boundary portion of the plurality of subpixels SP. For example, as illustrated in FIG. 3, a portion of an end of the first color filter CF1 may overlap a portion of an end of the second color filter CF2, at the boundary portion between the subpixels SP. The first color filter CF1 and the second color filter CF2 may be sequentially formed without being simultaneously formed, and thus, a portion of the end of the first color filter CF1 may overlap a portion of the end of the second color filter CF2, at the boundary portion between the subpixels SP. Therefore, in the display apparatus 100 according to an embodiment of the present disclosure, light emitted from each subpixel SP may be prevented from being irradiated onto an adjacent subpixel SP using color filters overlapping at the boundary portion between the subpixels SP, and thus, color mixture between the subpixels SP may be prevented.

Furthermore, as illustrated in FIG. 2, because the first line SL1 passes through a boundary portion between subpixels SP, color filters CF having different colors may overlap each other in the first line SL1. Therefore, at least a portion of an overlap portion of the color filter CF may overlap the first line SL1 in a thickness direction of the first substrate 110.

With further reference to FIGS. 3 and 4, the protrusion portion PTP may be provided on the planarization layer 113. A material included in the protrusion portion PTP may be coated on a whole upper surface of the planarization layer 113 by a certain thickness, and then, may be patterned by an exposure process, thereby forming the protrusion portion PTP. In the exposure process, a mask including an opening portion may be used. In the exposure process, a shape of the protrusion portion PTP may be changed based on the intensity and/or exposure time of light. For example, as in FIGS. 3 and 4, the protrusion portion PTP may be formed to include a cross-sectional surface having a trapezoid shape where a width of the upper surface PTPa is narrower than that of the lower surface thereof. Therefore, the lateral surface PTPb of the protrusion portion PTP and the upper surface 113*a* of the planarization layer 113 contacting the lower surface of the protrusion portion PTP may be provided at an acute angle of less than 90 degrees. In this case, the upper surface PTPa of the protrusion portion PTP and the lateral surface PTPb of the protrusion portion PTP is provided at an angle of more than 90 degrees and less than 180 degrees. For example, the upper surface PTPa of the protrusion portion PTP and the lateral surface PTPb of the protrusion portion PTP may be provided at an obtuse angle. The protrusion portion PTP may include the same material as that of the planarization layer 113, but embodiments of the present disclosure are not limited thereto.

The protrusion portion PTP according to an embodiment may be disposed in the emission region EA. This may denote that the most of the protrusion portion PTP is disposed in the emission region EA and may not denote that all of the protrusion portion PTP should be disposed in the emission region EA. However, the protrusion portion PTP may not be disposed in the circuit region CA. This may be because, when the protrusion portion PTP is disposed in the circuit region CA, light (or lateral light) traveling toward the lateral surface of the subpixel SP is reflected by the reflection portion 117 disposed in the circuit region CA, and thus, the reflected light is blocked by the TFT and/or the line of the circuit region CA and is not irradiated in a forward direction. Accordingly, as in FIGS. 3 and 4, the protrusion portion PTP may not be disposed in the circuit region CA and may be disposed in the emission region EA.

On the other hand, because the reflection portion 117 described below should generate an electric field along with the anode electrode 114 in the emission region EA and should reflect the lateral light of the organic emission layer on the lateral surface PTPb of the protrusion portion PTP, the reflection portion 117 may be disposed in the emission region EA and the circuit region CA. For example, the reflection portion 117 may be disposed on the upper surface PTPa of the protrusion portion PTP and may be disposed in common in the plurality of subpixels SP.

As a result, in the display apparatus 100 according to an embodiment of the present disclosure, as in FIG. 3, an edge including the lateral surface PTPb of the protrusion portion PTP may overlap the non-emission region NEA adjacent to the emission region EA, and the most of the protrusion portion PTP may have a structural feature capable of overlapping the emission region EA. The non-emission region NEA may denote a region, where light is not emitted, of the display area DA.

With further reference to FIGS. 3 and 4, the anode electrode 114 of the subpixel SP may be formed on the planarization layer 113. The anode electrode 114 may contact the drain electrode or the source electrode of the TFT 112 through a contact hole passing through the planarization layer 113 and the second layer 111c.

The anode electrode 114 may be provided to cover the protrusion portion PTP. Therefore, the anode electrode 114 may be disposed on the upper surface PTPa and the lateral surface PTPb of the protrusion portion PTP. As shown in FIGS. 3 and 4, the anode electrode 114 may contact the upper surface PTPa and the lateral surface PTPb of the protrusion portion PTP. Therefore, the anode electrode 114 may be formed on the protrusion portion PTP in a hat shape along a cross-sectional profile of each of the upper surface PTPa and the lateral surface PTPb of the protrusion portion PTP. A subsequent process, the organic emission layer 116 and the reflection portion 117 may be sequentially formed on the anode electrode 114, and thus, the anode electrode 114 may be disposed between the protrusion portion PTP and the reflection portion 117.

The anode electrode 114 may be made of at least one of a transparent metal material, a semi-transmissive metal material, or a metal material having high reflectance.

Because the display apparatus 100 according to an embodiment of the present disclosure is configured as the bottom emission type, the anode electrode 114 may be formed of a transparent conductive material (or TCO), such as indium tin oxide (ITO) or indium zinc oxide (IZO) capable of transmitting light, or a semi-transmissive conductive material such as magnesium (Mg), silver (Ag), or an alloy of Mg and Ag.

Meanwhile, the material constituting the anode electrode 114 may include MoTi. The anode electrode 114 may be a first electrode or a pixel electrode.

The insulation layer 115 is a non-light emission area in which light is not emitted, and may be provided to surround each of light emission areas (or light emitting portions) of each of the plurality of subpixels SP. For example, the insulation layer 115 may partition (or define) the respective light emission areas (or light emitting portions).

The insulation layer 115 according to an example may be formed on the planarization layer 113 to cover an edge of the anode electrode 114, thereby partitioning (or defining) the light emission areas (or light emitting portions) of the plurality of subpixels SP.

The insulation layer 115 may be formed to cover the edge of the anode electrode 114 of each of the subpixels SP and expose a portion of each of the anode electrodes 114. For example, the insulating layer 115 may partially cover the anode electrode 114. Therefore, a current is concentrated on an end of each of the anode electrodes 114 to avoid a problem in which light emitting efficiency is degraded. An exposed portion of the anode electrode 114 that is not covered by the insulation layer 115 may be a light emission area EA. The emission region EA, as in FIGS. 3 and 4, may be formed on the protrusion portion PTP, and thus, may overlap at least a portion of the protrusion portion PTP in a thickness direction of the first substrate 110.

After the insulation layer 115 is formed, the organic emission layer 116 may be formed to cover the anode electrode 114 and the insulation layer 115. Accordingly, the insulation layer 115 may be provided between the anode electrode 114 and the organic emission layer 116. The insulation layer 115 may be referred to as a pixel definition layer or a bank.

In the display apparatus 100 according to an embodiment of the present disclosure, the insulation layer 115 may include an inorganic material. The insulation layer 115 according to an embodiment may include an inorganic material. In the display apparatus 100 according to an embodiment of the present disclosure, because the protrusion portion PTP is provided on the planarization layer 113, when the insulation layer includes an organic material, the organic material may flow to a periphery of the protrusion portion PTP due to the protrusion portion PTP having a protrusion structure (or a stepped structure) protruding from the planarization layer 113, and due to this, a thickness of the insulation layer may not uniformly be formed. When a thickness of the insulation layer is not uniform, a shape of each of the organic emission layer 116 and the reflection portion 117 formed in a subsequent process may not uniformly be formed, and due to this, light may not be emitted uniformly and lateral light may not be uniformly reflected in a forward direction. Therefore, in the display apparatus 100 according to an embodiment of the present disclosure, because the insulation layer 115 includes an inorganic material, the insulation layer 115 which is thin and has a uniform thickness may be formed on the anode electrode 114 through a chemical vapor deposition (CVD) process. Accordingly, in the display apparatus 100 according to an embodiment of the present disclosure, the organic emission layer 116 and the reflection portion 117 may be uniformly formed along a profile of the insulation layer 115 having a uniform thickness, and thus, comparing with a case where the insulation layer 115 includes an organic material, light may be uniformly emitted and lateral light may be uniformly reflected in the forward direction, thereby more enhancing light efficiency.

As shown in FIGS. 3 and 4, the organic emission layer 116 may be formed on the anode electrode 114 and the insulation layer 115. The organic emission layer 116 may be provided between the anode electrode 114 and the reflection portion 117, and thus, when a voltage is applied to each of the anode electrode 114 and the reflection portion 117, a hole and an electron may move to the organic emission layer 116. The hole and the electron which have moved to the organic emission layer 116 may be combined with each other to emit light in the organic emission layer 116. The organic emission layer 116 may be formed as a common layer provided on the insulation layer 115 and the plurality of subpixels SP.

The organic emission layer 116 according to an embodiment may be provided to emit white light. The organic emission layer 116 may include a plurality of stacks which emit lights of different colors. For example, the organic emission layer 116 may include a first stack, a second stack, and a charge generating layer (CGL) provided between the first stack and the second stack. The organic emission layer 116 may be provided to emit the white light, and thus, each of the plurality of subpixels SP1 to SP3 may include a color filter CF suitable for a corresponding color.

The first stack may be provided on the anode electrode 114 and may be implemented a structure where a hole injection layer (HIL), a hole transport layer (HTL), an emission layer (EML(B)), and an electron transport layer (ETL) are sequentially stacked.

The charge generating layer may supply an electric charge to the first stack and the second stack. The charge generating layer may include an N-type charge generating layer for supplying an electron to the first stack and a P-type charge generating layer for supplying a hole to the second stack. The N-type charge generating layer may include a metal material as a dopant.

The second stack may be provided on the first stack and may be implemented in a structure where a hole transport layer (HTL), a yellow-green (YG) emission layer (EML (YG)), and an electron injection layer (EIL) are sequentially stacked.

In the display apparatus 100 according to an embodiment of the present disclosure, because the organic emission layer 116 is provided as a common layer, the first stack, the charge generating layer, and the second stack may be arranged all over the plurality of subpixels SP1 to SP4.

According to another embodiment, the organic emission layer 116 may be provided to emit lights of different colors and may be patterned in each of the plurality of subpixels SP. However, in this case, a hole injection layer (HIL), a hole transport layer (HTL), an emission transport layer (ETL), and an electron injection layer (EIL) except an emission layer may be arranged as a common layer in the subpixels SP. Also, in a case where the organic emission layer 116 is patterned in each of the subpixels SP, a color filter may not be provided between the first substrate 110 and the organic emission layer 116.

As illustrated in FIG. 3, the insulation layer 115 may be disposed between the anode electrode 114 and the reflection portion 117 on the lateral surface PTPb of the protrusion portion PTP, and thus, the organic emission layer 116 on the lateral surface PTPb of the protrusion portion PTP may not emit light. The organic emission layer 116 may include an organic material and may be formed through an evaporation process, and thus, a thickness may be thinner in a slope structure of the lateral surface PTPb of the protrusion portion PTP than a flat structure of the upper surface PTPa of the protrusion portion PTP. Accordingly, the organic emission layer 116 which is provided to a relatively thin thickness on the lateral surface PTPb of the protrusion portion PTP may be lower in resistance than the organic emission layer 116 having a flat structure. Therefore, when the organic emission layer 116 which is provided to a relatively thin thickness on the lateral surface PTPb of the protrusion portion PTP emits light, a lifetime of the organic emission layer 116 may decrease as a current concentrates thereon, and thus, the total reliability of the organic emission layer 116 provided as a common layer may be reduced.

Therefore, in the display apparatus 100 according to an embodiment of the present disclosure, the insulation layer 115 may be disposed between the anode electrode 114 and the reflection portion 117 on the lateral surface PTPb of the protrusion portion PTP, and thus, may prevent light from being emitted from the organic emission layer 116 on the lateral surface PTPb of the protrusion portion PTP, thereby preventing a reduction in total lifetime of the organic emission layer 116 and a reduction in reliability.

Furthermore, the insulation layer 115 may cover the anode electrode 114 on the lateral surface PTPb of the protrusion portion PTP and may extend up to an edge of the anode electrode 114 on the upper surface PTPa of the protrusion portion PTP. When the insulation layer 115 does not cover all of the anode electrode 114 on the lateral surface PTPb of the protrusion portion PTP and covers only a portion of the anode electrode 114, the organic emission layer 116 on the lateral surface PTPb of the protrusion portion PTP may emit light, and thus, as described above, the lifetime and reliability of the organic emission layer 116 may be reduced.

Therefore, in the display apparatus 100 according to an embodiment of the present disclosure, the insulation layer 115 may be provided to cover all of the anode electrode 114 on the lateral surface PTPb of the protrusion portion PTP and extend up to an edge of the anode electrode 114 on the upper surface PTPa of the protrusion portion PTP, and thus, may prevent light from being emitted from the organic emission layer 116 on the lateral surface PTPb of the protrusion portion PTP. Accordingly, as illustrated in FIGS. 3 and 4, one end 115*a* of the insulation layer 115 may be disposed on the upper surface PTPa of the protrusion portion PTP. In this case, the reflection portion 117 may contact an upper surface of the organic emission layer 116 on the upper surface PTPa of the protrusion portion PTP, and the anode electrode 114 may contact a lower surface of the organic emission layer 116 on the upper surface PTPa of the protrusion portion PTP. Although not shown, the other end of the insulation layer 115 may be disposed on an upper surface of a protrusion portion included in a different subpixel.

As a result, in the display apparatus 100 according to an embodiment of the present disclosure, the organic emission layer 116 may emit light on only the upper surface PTPa of the protrusion portion PTP and may not emit light on the lateral surface PTPb of the protrusion portion PTP.

With further reference to FIGS. 3 and 4, the reflection portion 117 may be provided on the lateral surface PTPb of the protrusion portion PTP. The reflection portion 117 according to an embodiment may include a metal material. The reflection portion 117 may reflect light, which is emitted from the organic emission layer 116 in the plurality of subpixels SP and travels to the lateral surface of each subpixel SP, toward a lower surface of the first substrate 110. Therefore, in the display apparatus 100 according to an embodiment of the present disclosure, due to the reflection portion 117 provided on the lateral surface PTPb of the protrusion portion PTP, light L irradiated onto the lower surface of the first substrate 110 may increase, and thus, forward light efficiency may be enhanced. For example, the display apparatus 100 according to an embodiment of the present disclosure may increase about 17.28% more in forward light efficiency than an organic light emitting display apparatus of the bottom emission type where a groove is formed and a reflection portion is disposed therein.

The reflection portion 117 may be formed on the organic emission layer 116. The reflection portion 117 may be provided on the lateral surface PTPb of the protrusion portion PTP and may extend up to the upper surface PTPa of the protrusion portion PTP and an upper surface of the planarization layer 113 including no protrusion portion PTP. Accordingly, the reflection portion 117 may be a common layer which is formed in common in the subpixels SP and may be disposed on the anode electrode 114.

Because the display apparatus 100 according to an embodiment of the present disclosure is the bottom emission type and should reflect light on the lateral surface PTPb of the protrusion portion PTP, the reflection portion 117 may include a metal material which is high in reflectance. The reflection portion 117 according to an embodiment may include a metal material, which is high in reflectance, such as a stacked structure (Ti/Al/Ti) of aluminum (Al) and titanium (Ti), a stacked structure (ITO/Al/ITO) of Al and indium tin oxide (ITO), an Ag alloy, or a stacked structure (ITO/Ag alloy/ITO) of an Ag alloy and ITO. The Ag alloy may be an alloy of Ag, palladium (Pd), and copper (Cu). The reflection portion 117 may be referred to as an opposite electrode or a cathode electrode.

The encapsulation layer 118 may be formed on the reflection portion 117. The encapsulation layer 118 may prevent water or oxygen from penetrating into the organic emission layer 116 and the reflection portion 117. To this end, the encapsulation layer 118 may include at least one inorganic layer and at least one organic layer.

In the transparent display apparatus 100 according to an embodiment of the present disclosure, the encapsulation layer 118 may be disposed in the non-display area NDA as well as the display area DA. The encapsulation layer 118 according to an embodiment may be disposed between the reflection portion 117 and the second substrate 120.

As illustrated in FIGS. 3 and 4, the reflection portion 117 may be provided on the lateral surface PTPb of the protrusion portion PTP, and thus, an irradiation path of light reflected by the reflection portion 117 may be changed based on a slope angle of the lateral surface PTPb of the protrusion portion PTP with respect to the lower surface of the protrusion portion PTP (or the upper surface 113a of the planarization layer 113 contacting the protrusion portion PTP). For example, in the transparent display apparatus 100 according to an embodiment of the present disclosure, a slope angle θ1 (or a first angle θ1) of the lateral surface PTPb of the protrusion portion PTP with respect to the lower surface of the protrusion portion PTP may be an acute angle, and thus, as in FIG. 3, the reflection portion 117 may reflect light, traveling toward the lateral surface of the subpixel SP, toward the lower surface of the first substrate 110. Here, the first angle θ1 may be 30 degrees or more and less than 90 degrees.

As in FIG. 3, in a case where it is assumed that a thickness T of the protrusion portion PTP is constant, when the first angle θ1 is less than 30 degrees, a length of the lateral surface PTPb of the protrusion portion PTP may increase, and thus, an area of the emission region EA may be relatively reduced, causing a reduction in emission efficiency. Also, when the first angle θ1 is 90 degrees or more, an edge of the upper surface PTPa of the protrusion portion PTP may function as a covering film in forming the organic emission layer 116, and thus, a shadow region where the organic emission layer 116 is not deposited may occur, causing a reduction in reliability of the organic emission layer 116.

Therefore, in the display apparatus 100 according to an embodiment of the present disclosure, because the first angle θ1 is 30 degrees or more and less than 90 degrees, a reduction in area of the emission region EA may be prevented to prevent a reduction in emission efficiency, and the occurrence of a non-deposition region of the organic emission layer 116 may be prevented, thereby enhancing reliability.

Furthermore, as the first angle θ1 is 30 degrees or more and less than 90 degrees, a second angle θ2 between the lateral surface PTPb of the protrusion portion PTP and the upper surface PTPa of the protrusion portion PTP may be more than 90 degrees and less than 180 degrees. For example, the second angle θ2 may be an obtuse angle.

As shown in FIGS. 3 and 5, in the display apparatus 100 according to an embodiment of the present disclosure, a width W1 of the first line SL1 may be narrower than or equal to a width W2 of the insulation layer 115 between the plurality of subpixels SP. When the width W1 of the first line SL1 is wider than the width W2 of the insulation layer 115 between the plurality of subpixels SP, light reflected by the reflection portion 117 on the lateral surface PTPb of the protrusion portion PTP may be blocked by an edge of the first line SL1, and thus, the enhancement of light efficiency may be slight.

When the width W1 of the first line SL1 is wider than the width of the insulation layer 115 between the plurality of subpixels SP, the edge of the first line SL1 may more protrude toward the emission region EA than the insulation layer 115. In this case, lateral light reflected by the reflection portion 117 may be blocked by the edge of the first line SL1 protruding toward the emission region EA, and thus, may not be irradiated toward the first substrate 110, whereby the enhancement of light efficiency may be slight.

Therefore, in the display apparatus 100 according to an embodiment of the present disclosure, the width W1 of the first line SL1 may be narrower than or equal to the width W2 of the insulation layer 115 between the plurality of subpixels SP, light reflected by the reflection portion 117 may not interfere in the first line SL1 and may be irradiated toward the first substrate 110, thereby more enhancing forward light efficiency. Here, the first line SL1 may be a reference line. For example, when the first line SL1 is a line which transfers power like the pixel power line or the common power line, the width W1 of the first line SL1 may be narrower than or equal to the width W2 of the insulation layer 115 within a range where a resistance does not increase.

Anode electrodes 114 contacting an upper surface of the planarization layer 113 between the plurality of subpixels SP are electrodes of different subpixels SP, and thus, may be disposed apart from one another by a certain distance.

In the display apparatus 100 according to an embodiment of the present disclosure, the protrusion portion PTP protruding from the planarization layer 113 may be provided, and thus, may have a structure where the reflection portion 117 is disposed on the lateral surface PTPb of the protrusion portion PTP. Accordingly, the reflection portion 117 may reflect the lateral light traveling toward an adjacent subpixel SP, which does not emit light, from a subpixel SP emitting light, thereby preventing color mixture between subpixels SP.

The general organic light emitting display apparatus of the bottom emission type may have a structure where a groove is formed in a bank at a boundary portion between subpixels and a reflection electrode is disposed along the groove to prevent the occurrence of color mixture. Accordingly, in the general organic light emitting display apparatus of the bottom emission type, because the groove should be formed at a center of the bank, there is a problem where a design margin is excessively limited.

However, in the display apparatus 100 according to an embodiment of the present disclosure, because the protrusion portion PTP is provided in each subpixel SP, a general color mixture prevention structure where a groove is formed in a bank may be deleted, and thus, the degree of freedom in design margin may be more enhanced.

Moreover, in the display apparatus 100 according to an embodiment of the present disclosure, the color mixture prevention structure may be deleted, and thus, a width of a boundary portion between subpixels SP may be more reduced. Accordingly, in the display apparatus 100 according to an embodiment of the present disclosure, an area of the emission region EA of each subpixel SP may relatively more increase, thereby more enhancing light efficiency than a general display apparatus.

As a result, the display apparatus 100 according to an embodiment of the present disclosure may have a structure where the protrusion portion PTP is included in each subpixel SP and the reflection portion 117 is disposed on a slope surface of the protrusion portion PTP, and thus, may prevent the occurrence of color mixture between subpixels SP even without a groove being formed in a bank unlike a general display apparatus. Accordingly, in the display apparatus 100 according to an embodiment of the present disclosure, because a general color mixture prevention structure is deleted, the degree of freedom in design margin may be more enhanced than the general display apparatus, and thus, reliability and a yield rate may increase and an area (or an opening ratio) of the emission region EA may more increase than the general display apparatus, thereby more enhancing light efficiency.

Additionally, in the display apparatus 100 according to an embodiment of the present disclosure, a length (or an area) of the reflection portion 117 disposed on the slope surface of the protrusion portion PTP may be adjusted by adjusting a thickness of the protrusion portion PTP and/or an angle of the slope surface of the protrusion portion PTP.

For example, in the display apparatus 100 according to an embodiment of the present disclosure, when a thickness of the protrusion portion PTP increases or an angle of the slope surface of the protrusion portion PTP is low, or when a thickness of the protrusion portion PTP increases and an angle of the slope surface of the protrusion portion PTP is low, a length (or an area) of the slope surface of the protrusion portion PTP may increase, and thus, a length (or an area) of the reflection portion 117 disposed on the slope surface of the protrusion portion PTP may increase. Accordingly, the display apparatus 100 according to an embodiment of the present disclosure may more reflect lateral light, traveling to an adjacent subpixel SP, as forward light by an increased length (or area) of the reflection portion 117, thereby enhancing forward light extraction efficiency.

As a result, in the display apparatus 100 according to an embodiment of the present disclosure, because there is a limitation in depth of a groove formed in a boundary portion between subpixels, light extraction efficiency may be more enhanced than a general display apparatus where a length (or an area) of a reflection portion is limited.

Figure 6:
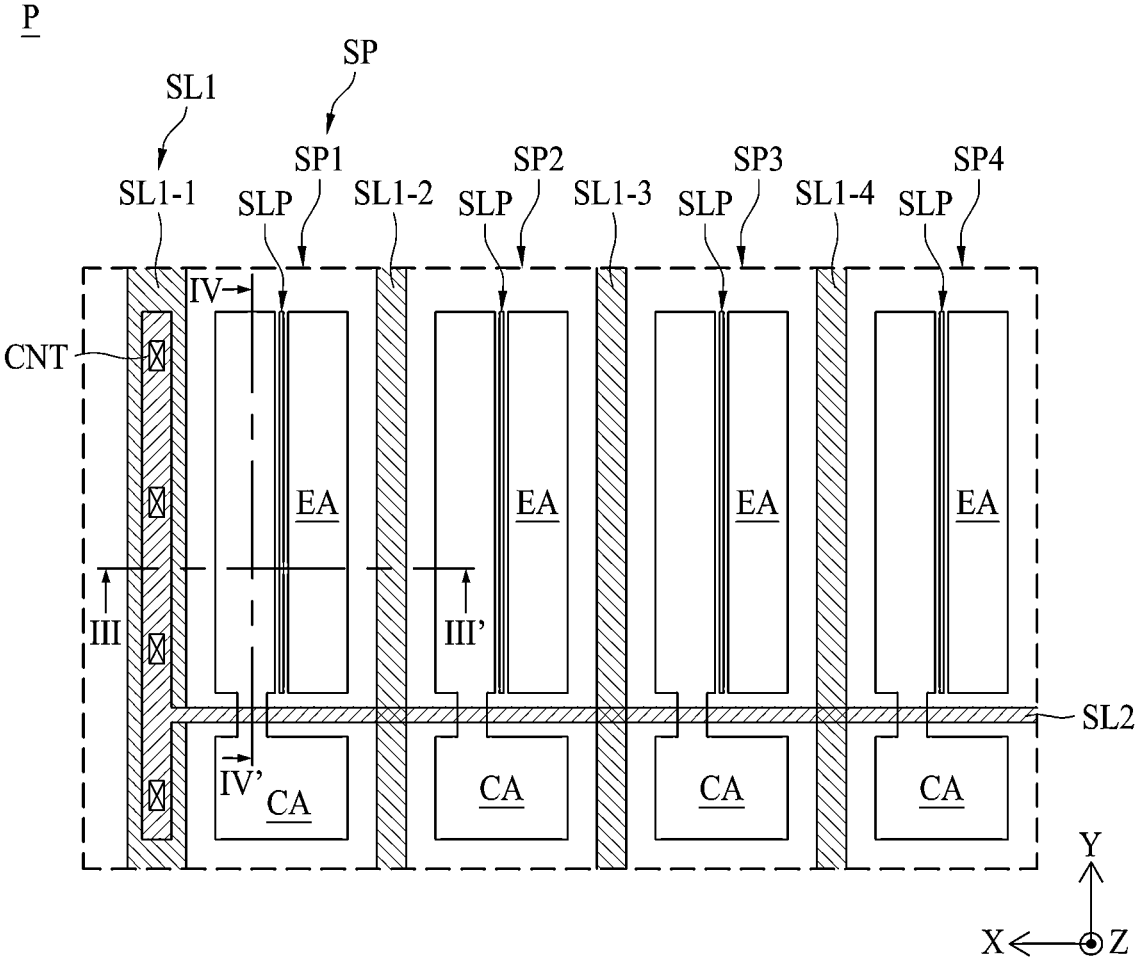
FIG. 6 is a schematic plan view of a display apparatus according to a second embodiment of the present disclosure.
Figure 7:
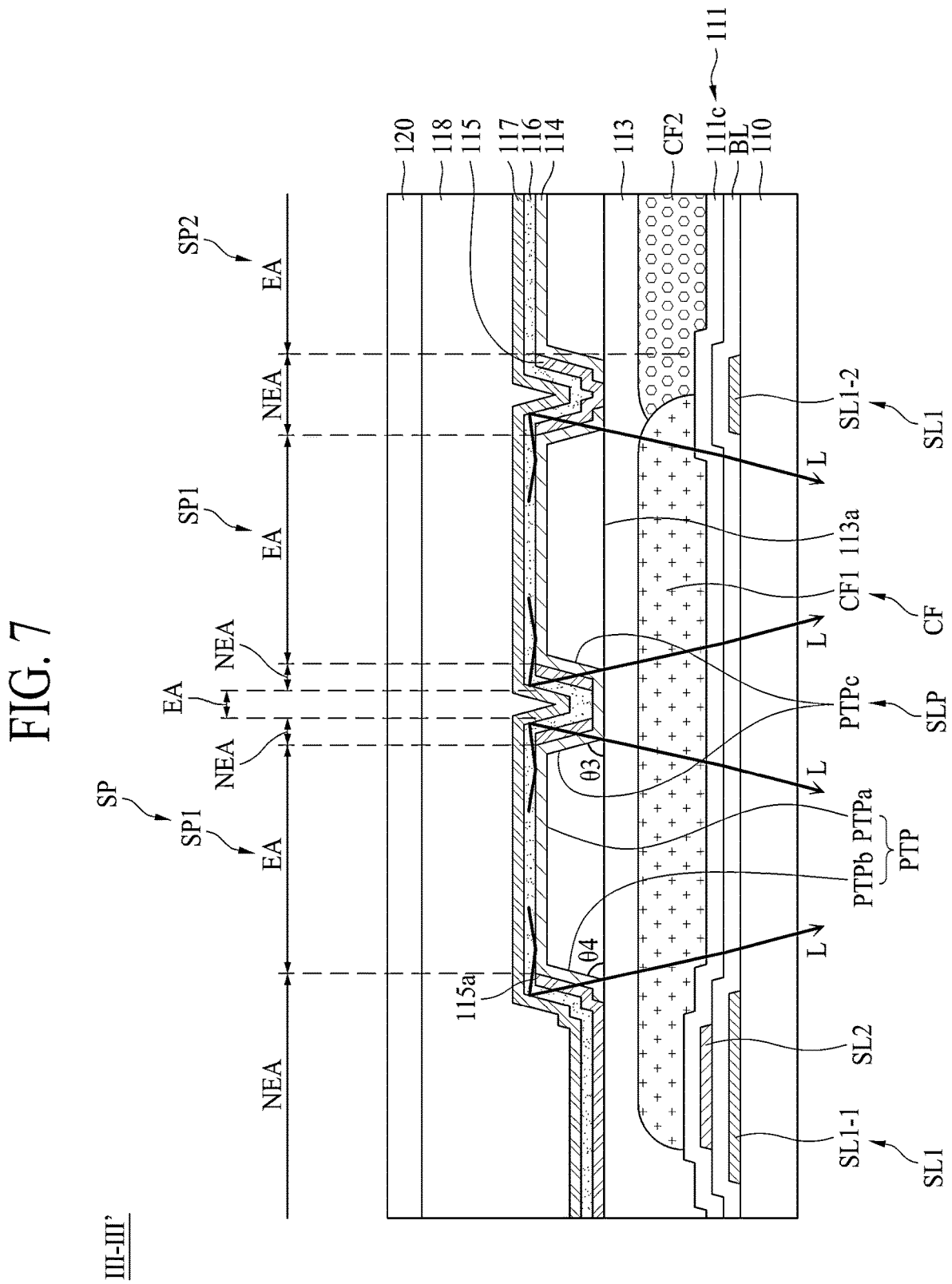
FIG. 7 is a schematic cross-sectional view taken along line III-III' illustrated in FIG. 6.
Figure 8:
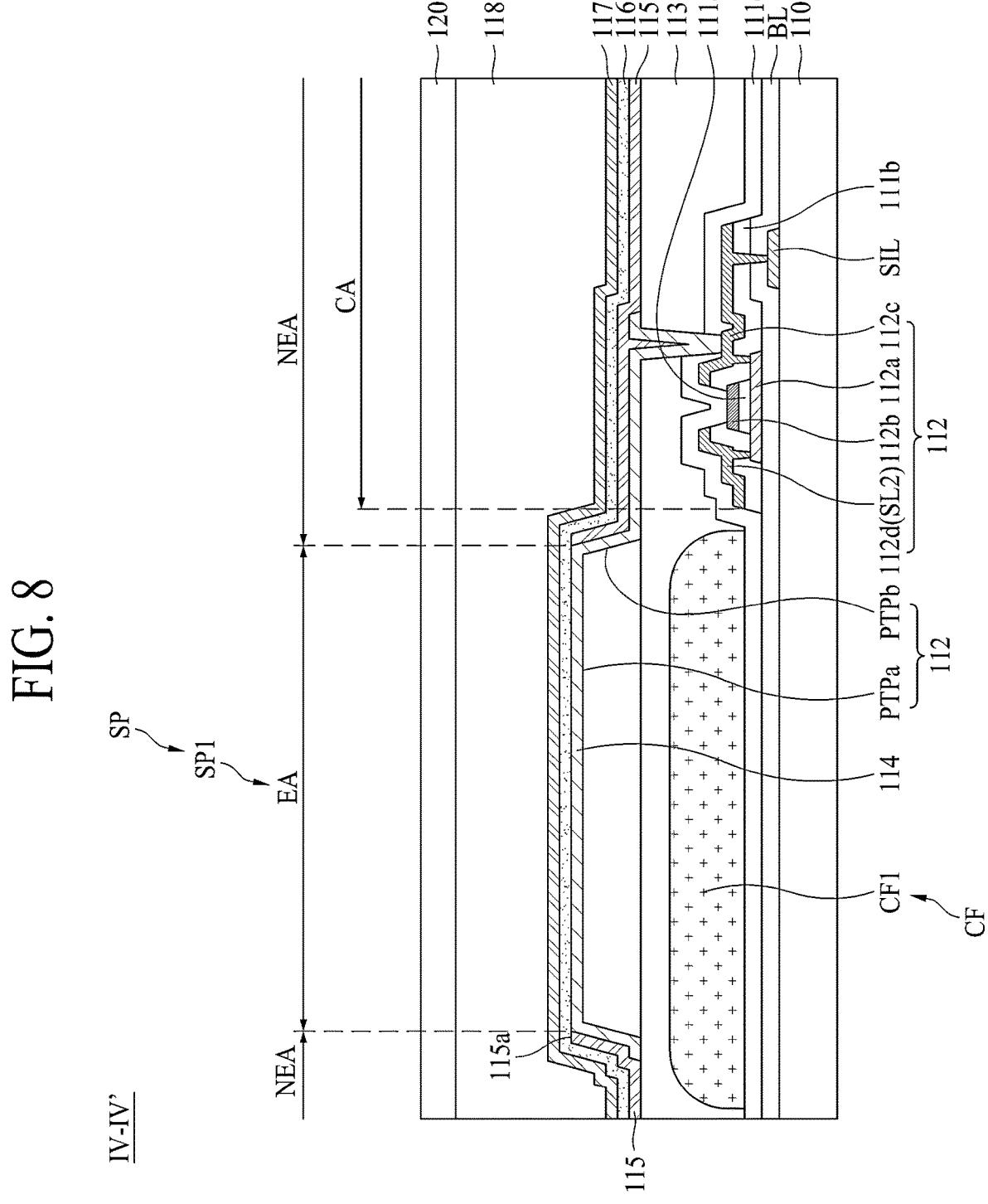
FIG. 8 is a schematic cross-sectional view taken along line IV-IV' illustrated in FIG. 6.

FIG. 6 is a schematic plan view of a display apparatus 100 according to a second embodiment of the present disclosure, FIG. 7 is a schematic cross-sectional view taken along line III-III' illustrated in FIG. 6, and FIG. 8 is a schematic cross-sectional view taken along line IV-IV' illustrated in FIG. 6.

As illustrated in FIGS. 6 to 8, except for that the display apparatus 100 according to the second embodiment of the present disclosure further includes a slit portion SLP which divides a protrusion portion PTP into two or more portions, the display apparatus 100 according to the second embodiment of the present disclosure may be the same as the display apparatus of FIG. 1 described above. Hereinafter, therefore, like reference numerals refer to like elements, and only different elements will be described.

In the display apparatus of FIG. 1 described above, the reflection portion 117 may be provided on the lateral surface PTPb of the protrusion portion PTP and may reflect light, which is emitted from the organic emission layer 116 and travels toward a boundary portion (e.g., a lateral surface of each subpixel SP) between a plurality of subpixels SP, toward a front surface (or the emission region EA of each subpixel SP). Therefore, the display apparatus of FIG. 1 may enhance forward light efficiency using the reflection portion 117 provided on the lateral surface PTPb of the protrusion portion PTP at a boundary portion between subpixels SP. As a result, the display apparatus of FIG. 1 may have a structural feature where the reflection portion 117 for enhancing forward light efficiency surrounds the lateral surface PTPb of the protrusion portion PTP disposed at a boundary portion between subpixels SP.

On the other hand, the display apparatus of FIG. 6 may further include the slit portion SLP which divides the protrusion portion PTP into two or more portions. The slit portion SLP according to an embodiment may be formed in the protrusion portion PTP by additionally performing a process of patterning (or etching) the protrusion portion PTP in a first direction (a Y-axis direction) and/or a second direction (an X-axis direction) with respect to a center of the protrusion portion PTP after the protrusion portion PTP of FIG. 1 is formed. However, embodiments of the present disclosure are not limited thereto, and the slit portion SLP may be formed in the protrusion portion PTP protruding to a planarization layer 113 through one process using a halftone mask after a material of the protrusion portion PTP is formed on the planarization layer 113. Therefore, in the display apparatus of FIG. 6, two or more protrusion portions PTP may be provided in one subpixel SP, and an area of each protrusion portion PTP may be provided to be less than that of the protrusion portion PTP included in the display apparatus of FIG. 1. For example, as illustrated in FIG. 7, two protrusion portions PTP (or emission region EA) may be provided in a first subpixel SP1. Also, one slit portion SLP may be disposed between two protrusion portions PTP (or emission region EA).

As in FIG. 7, in the display apparatus 100 according to the second embodiment of the present disclosure, because the slit portion SLP is provided in the protrusion portion PTP, an anode electrode 114 and a reflection portion 117 may be disposed to extend up to an upper surface PTPa of the protrusion portion PTP and the slit portion SLP from a lateral surface PTPb of the protrusion portion PTP.

The slit portion SLP may be formed by patterning (or etching) a material included in the protrusion portion PTP in forming the protrusion portion PTP, and thus, the anode electrode 114 provided in the slit portion SLP may partially contact an upper surface of the planarization layer 113 at the slit portion SLP. Also, because the slit portion SLP is formed by patterning (or etching) the material of the protrusion portion PTP in forming the protrusion portion PTP, an inclined lateral surface may be formed in the protrusion portion PTP.

In the display apparatus 100 according to the second embodiment of the present disclosure, an inclined lateral surface of the protrusion portion PTP may be an inner surface PTPc. Therefore, as in FIG. 7, the protrusion portion PTP may further include the inner surface PTPc in the slit portion SLP. Because the slit portion SLP is provided in the protrusion portion PTP of FIG. 1, the inner surface PTPc may be provided in plurality in the slit portion SLP. As in FIG. 7, two inner surfaces PTPc provided in the slit portion SLP may be disposed apart from each other in the slit portion SLP. Also, two inner surfaces PTPc provided in the slit portion SLP may be disposed to face each other with respect to the anode electrode 114 contacting the planarization layer 113 (or an upper surface 113a of the planarization layer 113). In this case, slope angles of inner surfaces PTPc with respect to the upper surface 113a of the planarization layer 113 may be set to be equal or similar to one another. This may be because a plurality of inner surfaces PTPc are simultaneously formed through one process of forming the slit portion SLP. The upper surface 113a of the planarization layer 113 may denote an upper surface 113a of the planarization layer 113 contacting a lower surface of each protrusion portion PTP provided in one subpixel SP.

As illustrated in FIG. 7, in the display apparatus 100 according to the second embodiment of the present disclosure, the reflection portion 117 may be provided on the inner surface PTPc of the protrusion portion PTP, and thus, with respect to one subpixel SP, lateral light of an organic emission layer 116 may be reflected by an inner portion of the subpixel SP as well as an edge of the subpixel SP. Here, an edge of a subpixel SP may denote a portion of a subpixel SP where a lateral surface PTPb or an outer surface of the protrusion portion PTP is provided, and an inner portion of a subpixel SP may denote a portion of a subpixel SP where the inner surface PTPc of the protrusion portion PTP is provided. Therefore, comparing with the display apparatus of FIG. 1, in the display apparatus 100 according to the second embodiment of the present disclosure, an area where the lateral light of the organic emission layer 116 is reflected may be relatively larger provided, and thus, forward light efficiency may be more enhanced.

Furthermore, after the anode electrode 114 is formed to cover the inner surface PTPc of the protrusion portion PTP, an insulation layer 115 and the organic emission layer 116 may be sequentially formed. Therefore, the organic emission layer 116 may contact each of the reflection portion 117 and the anode electrode 114 contacting the planarization layer 113 in the slit portion SLP. Accordingly, in the display apparatus 100 according to the second embodiment of the present disclosure, the organic emission layer 116 may emit light between the reflection portion 117 and the anode electrode 114 flatly provided in the slit portion SLP.

In accordance with the example of FIG. 7, the insulation layer 115 may be provided in the slit portion SLP. In the display apparatus 100 according to the second embodiment of the present disclosure, the inner surface PTPc of the protrusion portion PTP in the slit portion SLP may be provided to be inclined, and thus, a thickness of the organic emission layer 116 formed on the inner surface PTPc may be thinner than that of the organic emission layer 116 provided on a flat surface. In the display apparatus 100 according to the second embodiment of the present disclosure, as described above, when a thickness of the organic emission layer 116 is thin, a current may concentrate thereon, and due to this, the lifetime and reliability of the whole organic emission layer 116 may be reduced. Therefore, in the display apparatus 100 according to the second embodiment of the present disclosure, the insulation layer 115 may be provided between the anode electrode 114 and the reflection portion 117 on the inner surface PTPc of the protrusion portion PTP, and thus, may allow the organic emission layer 116 formed on the inner surface PTPc not to emit light. Accordingly, in the display apparatus 100 according to the second embodiment of the present disclosure, the organic emission layer 116 disposed on the inner surface PTPc in the slit portion SLP may be provided not to emit light, thereby preventing a reduction in lifetime of the organic emission layer 116 and preventing a reduction in reliability.

As described above, in the display apparatus 100 according to the second embodiment of the present disclosure, a portion of the organic emission layer 116 provided in the slit portion SLP may be provided to emit light, and the other portion of the organic emission layer 116 may be provided not to emit light. The organic emission layer 116 on the anode electrode 114 flatly provided in the slit portion SLP may be provided to emit light, and the organic emission layer 116 on the anode electrode 114 provided to be inclined in the slit portion SLP may be provided not to emit light. A dead zone where the organic emission layer 116 does not emit light may be between protrusion portions PTP disposed in one subpixel SP (or in one subpixel SP), and due to this, light efficiency may be reduced. However, the display apparatus 100 according to the second embodiment of the present disclosure may be implemented so that light efficiency enhancement based on lateral light reflection of the reflection portion 117 provided on the inner surface PTPc of the protrusion portion PTP is greater than light loss caused by the dead zone, and thus, may prevent a reduction in light efficiency caused by the dead zone. For example, in the display apparatus 100 according to the second embodiment of the present disclosure, a size (or an area) of the dead zone may be adjusted so that a lateral light reflectance of the reflection portion 117 provided on the inner surface PTPc of the protrusion portion PTP is greater than light loss caused by the dead zone. A size (or an area) of the dead zone may be adjusted based on an angle between the inner surface PTPc of the protrusion portion PTP and an upper surface 113a of the planarization layer 113 contacting the protrusion portion PTP and/or a thickness of the protrusion portion PTP.

As shown in FIGS. 7 and 8, in the display apparatus 100 according to the second embodiment of the present disclosure, the insulation layer 115 may not be disposed on the upper surface PTPa of the protrusion portion PTP. This may be because, when the insulation layer 115 is disposed on the upper surface PTPa of the protrusion portion PTP, an area of the anode electrode 114 covered by the insulation layer 115 is enlarged, and thus, a size (or an area) of an emission region EA decreases to cause a reduction in total emission efficiency. Accordingly, in the display apparatus 100 according to the second embodiment of the present disclosure, the insulation layer 115 may be provided not to be disposed on the upper surface PTPa of the protrusion portion PTP, and thus, light loss by the dead zone in the slit portion SLP may be compensated for and total light efficiency may be enhanced.

Furthermore, in the display apparatus 100 according to the second embodiment of the present disclosure, as in FIG. 7, the insulation layer 115 may not be provided on the anode electrode 114 which is flatly provided in the slit portion SLP. Also, the insulation layer 115 may not be provided on the anode electrode 114 which is flatly provided on the upper surface PTPa of the protrusion portion PTP. Accordingly, as illustrated in the example of FIG. 7, one end 115a of the insulation layer 115 may be provided to have a height which is equal or similar to that of an upper surface of the anode electrode 114 which is flatly provided on the upper surface PTPa of the protrusion portion PTP.

The reason that the insulation layer 115 is not provided on the anode electrode 114 flatly provided in the slit portion SLP and is not provided on the anode electrode 114 flatly provided on the upper surface PTPa of the protrusion portion PTP may be for compensating for light loss caused by the dead zone and enhancing light efficiency through the following process.

First, an inorganic material of the insulation layer 115 may cover the anode electrode 114, covering the slit portion SLP and the protrusion portion PTP, and the planarization layer 113 which is not covered by the anode electrode 114.

Subsequently, a photoresist may be disposed between boundary portions of subpixels SP. In this case, the photoresist may contact an upper surface of the insulation layer 115, disposed at a boundary portion between adjacent subpixels SP, and an upper surface of the insulation layer 115 disposed on the lateral surface PTPb of the protrusion portion PTP. Here, the photoresist may not be disposed in the slit portion SLP. This may be because, when the photoresist is disposed in the slit portion SLP, the insulation layer 115 flatly provided between the inner surfaces PTPc of the protrusion portion PTP remains without being patterned (or etched). In this case, all of the organic emission layer 116 disposed in the slit portion SLP may not emit light, causing a reduction in light efficiency. Accordingly, the photoresist may not be disposed in the slit portion SLP.

Subsequently, the insulation layer 115 on the anode electrode 114 on the upper surface PTPa of the protrusion portion PTP and the insulation layer 115 on the anode electrode 114 between the inner surfaces PTPc of the slit portion SLP may be patterned (or etched) through anisotropic etching. The anisotropic etching may be robust to linearity, and thus, the insulation layer 115 on the anode electrode 114 contacting the inner surface PTPc of the slit portion SLP may remain without being patterned (or etched).

Subsequently, the photoresist may be stripped, and the organic emission layer 116 and the reflection portion 117 may be sequentially formed, and thus, as in FIG. 7, two reflection portions 117 having a hat shape may be provided to face each other with the slit portion SLP therebetween in one subpixel SP. The two reflection portions 117 having a hat shape may be electrically connected with each other.

As a result, in the display apparatus 100 according to the second embodiment of the present disclosure, the insulation layer 115 may be provided not to be disposed on the anode electrode 114 flatly provided in the slit portion SLP and the anode electrode 114 flatly provided on the upper surface PTPa of the protrusion portion PTP, and thus, may prevent a reduction in size (or area) of the emission region EA. Accordingly, in the display apparatus 100 according to the second embodiment of the present disclosure, a reduction in light efficiency caused by the slit portion SLP formed between protrusion portions PTP of one subpixel SP may be minimized or prevented, and moreover, light efficiency may be enhanced.

Moreover, the display apparatus 100 according to the second embodiment of the present disclosure may be provided so that the insulation layer 115 is disposed between the anode electrode 114 and the reflection portion 117, on the inner surfaces PTPc of the protrusion portion PTP in the slit portion SLP, and thus, may prevent light from being emitted from the organic emission layer 116 on the inner surfaces PTPc of the protrusion portion PTP. Accordingly, in the display apparatus 100 according to the second embodiment of the present disclosure, light may be prevented from being emitted by the organic emission layer 116 which is formed to be relatively thin on the lateral surface PTPb and the inner surface PTPc of the protrusion portion PTP, and thus, a reduction in lifetime of the whole organic emission layer 116 may be prevented and a reduction in reliability may be prevented.

In accordance with the example of FIG. 7, in the display apparatus 100 according to the second embodiment of the present disclosure, a third angle θ3 between the inner surface PTPc of the protrusion portion PTP and the upper surface 113a of the planarization layer 113 contacting the protrusion portion PTP may be 60 degrees or more and less than 90 degrees.

Moreover, a fourth angle θ4 between the lateral surface PTPb of the protrusion portion PTP and the upper surface 113a of the planarization layer 113 contacting the protrusion portion PTP may be equal or similar to the third angle θ3. This may be because the lateral surface PTPb of the protrusion portion PTP and the inner surface PTPc of the protrusion portion PTP are simultaneously formed through the same pattern (or etching) process.

When the third angle θ3 is less than 60 degrees, the insulation layer 115 provided on the inner surface PTPc of the protrusion portion PTP may be removed by anisotropic etching, and when the third angle θ3 is 90 degrees or more, a shadow region may occur because the protrusion portion PTP functions as a covering film in forming the organic emission layer 116, whereby a region may occur where the organic emission layer 116 is not deposited.

Therefore, in the display apparatus 100 according to the second embodiment of the present disclosure, because the third angle θ3 between the inner surface PTPc of the protrusion portion PTP and the upper surface 113a of the planarization layer 113 contacting the protrusion portion PTP is 60 degrees or more and less than 90 degrees, light may be prevented from being emitted by the organic emission layer 116 on the inner surface PTPc of the protrusion portion PTP, and thus, a reduction in lifetime of the organic emission layer 116 may be prevented and the non-deposition of the organic emission layer 116 may be prevented, thereby enhancing reliability.

As a result, unlike a case where only one protrusion portion PTP is included in one subpixel SP, because the display apparatus 100 according to the second embodiment of the present disclosure includes the slit portion SLP which divides the protrusion portion PTP into two or more portions, the reflection portion 117 may be provided on the inner surface PTPc of the protrusion portion PTP, and thus, a reflection area of the lateral light of the organic emission layer 116 may increase. Accordingly, in the display apparatus 100 according to the second embodiment of the present disclosure, total light efficiency may be more enhanced than a case where only one protrusion portion PTP is included in one subpixel SP.

Figure 9A:
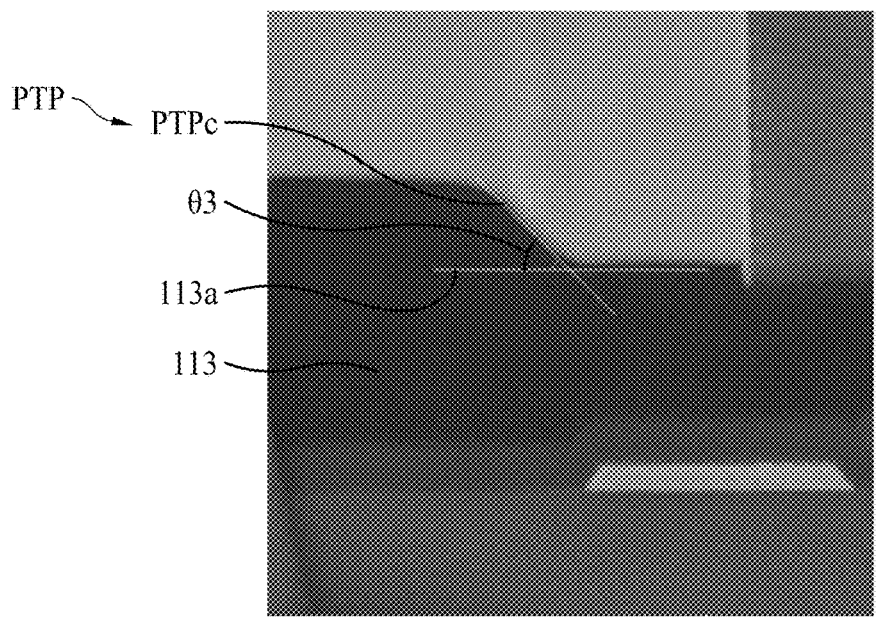
FIGS. 9A and 9B show simulation data for describing an insulation layer included in a slit portion of the display apparatus according to the second embodiment of the present disclosure.
Figure 9B:
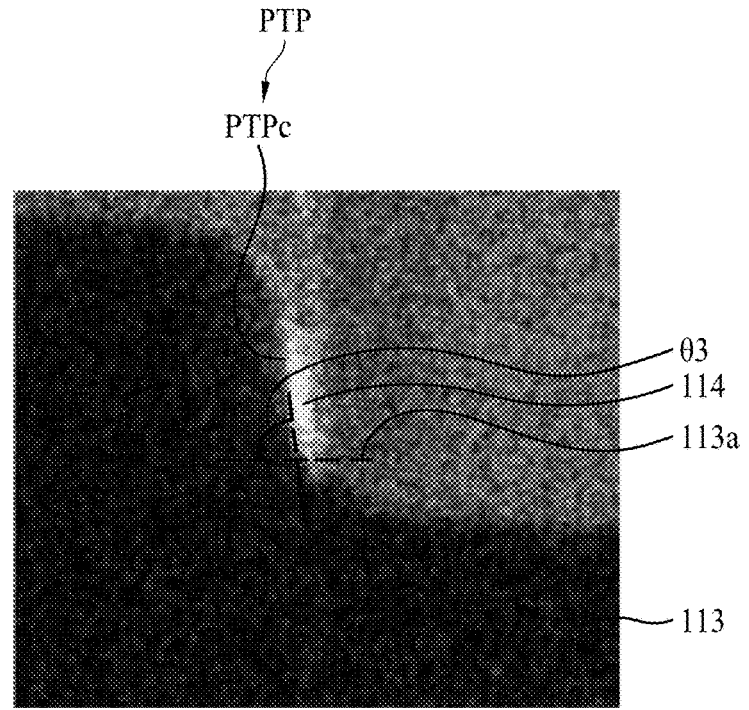

FIGS. 9A and 9B show simulation data for describing an insulation layer included in a slit portion of the display apparatus according to the second embodiment of the present disclosure.

FIG. 9A is a cross-sectional view of a comparative experiment after an anisotropic etching process is performed on the insulation layer 115, in a case where the third angle θ3 between the inner surface PTPc of the protrusion portion PTP and the lower surface of the protrusion portion PTP (or the upper surface 113a of the planarization layer 113 contacting the lower surface of the protrusion portion PTP) is 45 degrees. FIG. 9B is a cross-sectional view of an experiment after an anisotropic etching process is performed on the insulation layer 115, in a case where the third angle θ3 is 60 degrees or more and less than 90 degrees, in the display apparatus according to the second embodiment of the present disclosure.

As shown in the cross-sectional view of the comparative experiment of FIG. 9A, a comparative experiment after an anisotropic etching process is performed on the insulation layer 115, when the third angle θ3 between the inner surface PTPc of the protrusion portion PTP and the lower surface of the protrusion portion PTP (or the upper surface 113a of the planarization layer 113 contacting the lower surface of the protrusion portion PTP) is 45 degrees, it may be seen that the insulation layer 115 does not remain on the inner surface PTPc of the protrusion portion PTP and is removed by an anisotropic etching process.

On the other hand, in the display apparatus according to the second embodiment of the present disclosure of FIG. 9B, because the third angle θ3 between the inner surface PTPc of the protrusion portion PTP and the lower surface of the protrusion portion PTP (or the upper surface 113a of the planarization layer 113 contacting the lower surface of the protrusion portion PTP) is 60 degrees or more and less than 90 degrees, it may be seen that the insulation layer 115 is not removed and remains on the inner surface PTPc of the protrusion portion PTP by the anisotropic etching process robust to linearity.

Therefore, in the display apparatus 100 according to the second embodiment of the present disclosure, because the third angle θ3 between the inner surface PTPc of the protrusion portion PTP and the lower surface of the protrusion portion PTP (or the upper surface 113a of the planarization layer 113 contacting the lower surface of the protrusion portion PTP) is 60 degrees or more and less than 90 degrees, the insulation layer 115 including an inorganic material may be provided between the anode electrode 114 and the reflection portion 117 on the inner surface PTPc of the protrusion portion PTP. Accordingly, in the display apparatus 100 according to the second embodiment of the present disclosure, light may be prevented from being emitted by the organic emission layer 116 on the inner surface PTPc of the protrusion portion PTP in the slit portion SLP, and thus, a reduction in lifetime of the whole organic emission layer 116 may be prevented and a reduction in reliability of the whole organic emission layer 116 may be prevented.

Figure 10:
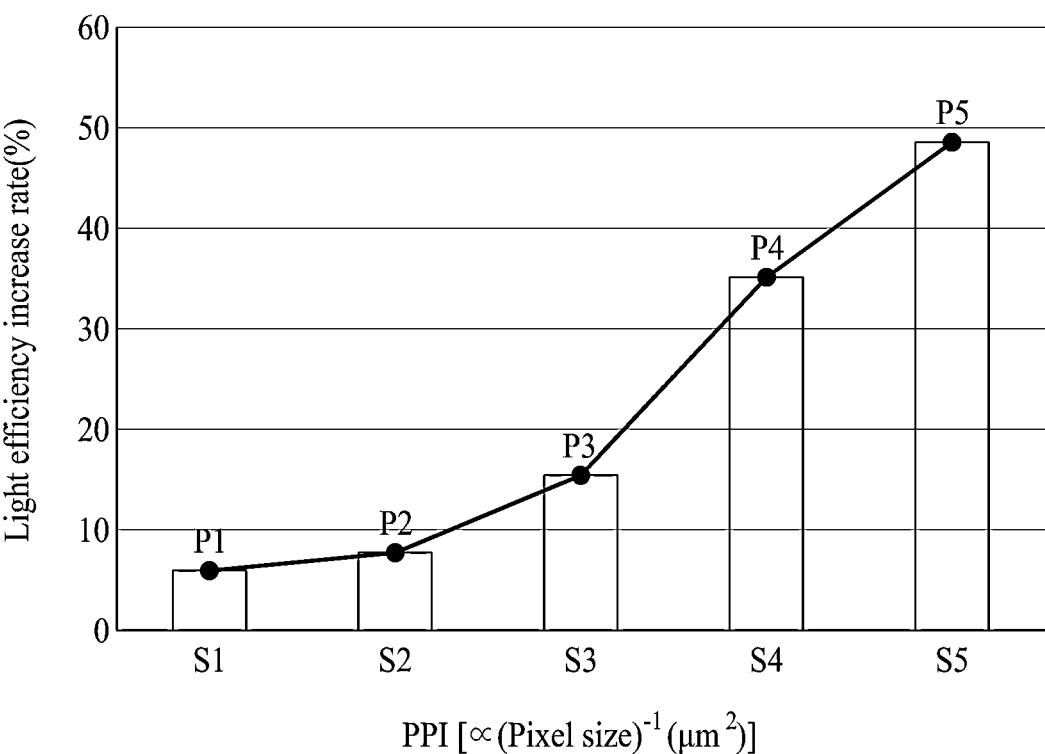
FIG. 10 is a graph showing a light efficiency increase rate with respect to a size of a pixel of a display apparatus according to the present disclosure.

FIG. 10 is a graph showing a light efficiency increase rate with respect to a size of a pixel of a display apparatus according to the present disclosure.

Here, the abscissa axis may represent pixels per inch (PPI) or a reciprocal number of a size (or an area) of a pixel P proportional to PPI, and the ordinate axis may represent a light efficiency increase rate with respect to PPI or the reciprocal number of the size (or the area) of the pixel P. When a size S1 of a pixel P is 165 μm×165 μm and a thickness T of a protrusion portion PTP is 2 μm, P1 may represent that a light efficiency increase rate is 5.9%, and when a size S2 of a pixel P is 50 μm×50 μm and a thickness T of a protrusion portion PTP is 2 μm, P2 may represent that a light efficiency increase rate is 7.6%. Also, when a size S3 of a pixel P is 12 μm×12 μm and a thickness T of a protrusion portion PTP is 2 μm, P3 may represent that a light efficiency increase rate is 15.4%, and when a size S4 of a pixel P is 3 μm×10 μm and a thickness T of a protrusion portion PTP is 2 μm, P4 may represent that a light efficiency increase rate is 35%. Also, when a size S5 of a pixel P is 3 μm×10 μm and a thickness T of a protrusion portion PTP is 2.7 μm, P5 may represent that a light efficiency increase rate is 48%.

As shown in FIG. 10, it may be seen that a right upward graph is formed where a light efficiency increase rate increases as a size (or an area) of a pixel P decreases progressively. Because a size (or an area) of a pixel P is proportional to a size (or an area) of a subpixel P, a size (or an area) of a pixel P may be proportional to a size (or an area) of a protrusion portion PTP in a subpixel P or a size (or an area) of an emission region EA.

PPI which is the number of pixels per one inch may increase as a size (or an area) of a pixel P decreases progressively, and thus, a size (or an area) of a pixel P may be inversely proportional to PPI. For example, in FIG. 10, PPI may increase progressively and a size (or an area) of an emission region EA (or a protrusion portion PTP) may decrease progressively toward a right side, and thus, it may be seen that a light efficiency increase rate increases.

Therefore, the display apparatus 100 according to the second embodiment of the present disclosure may be provided so that a protrusion portion PTP is divided into two or more portions by a slit portion SLP in one subpixel SP, and thus, a plurality of emission regions EA (or protrusion portions PTP) having a small size are disposed in one subpixel SP. Accordingly, in the display apparatus 100 according to the second embodiment of the present disclosure, the reflection portion 117 may be disposed between emission regions EA (or protrusion portions PTP) in one subpixel SP, and thus, a reflection area of the reflection portion 117 reflecting lateral light may increase, thereby more enhancing forward light efficiency. Also, in the display apparatus 100 according to the second embodiment of the present disclosure, as in P5, a thickness T of a protrusion portion PTP may be set to 2.7 μm which is thicker than P4, and thus, a reflection area of lateral light through the reflection portion 117 may more increase, thereby maximizing the enhancement of light efficiency.

Figure 11A:
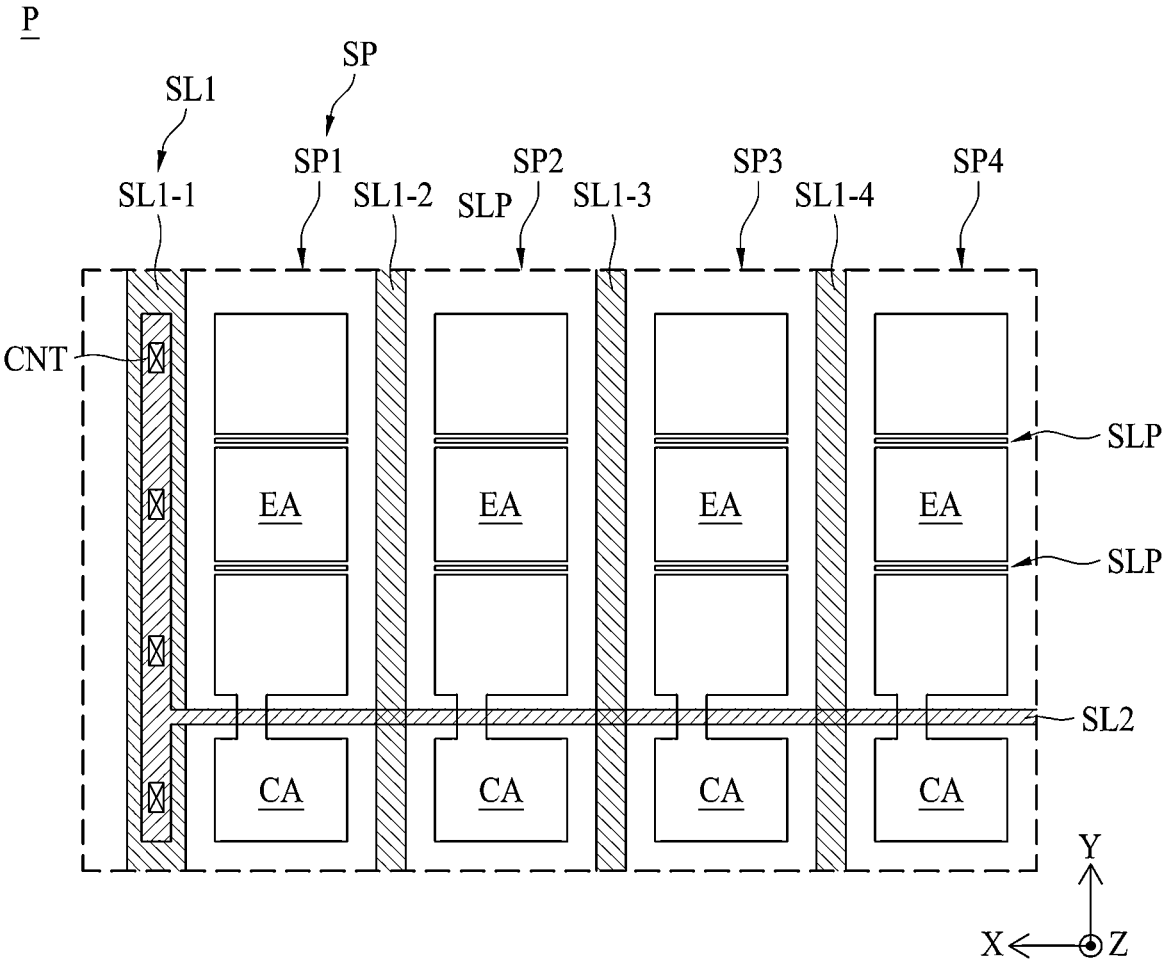
FIGS. 11A and 11B are plan views illustrating various modification embodiments of the display apparatus according to the second embodiment of the present disclosure.
Figure 11B:
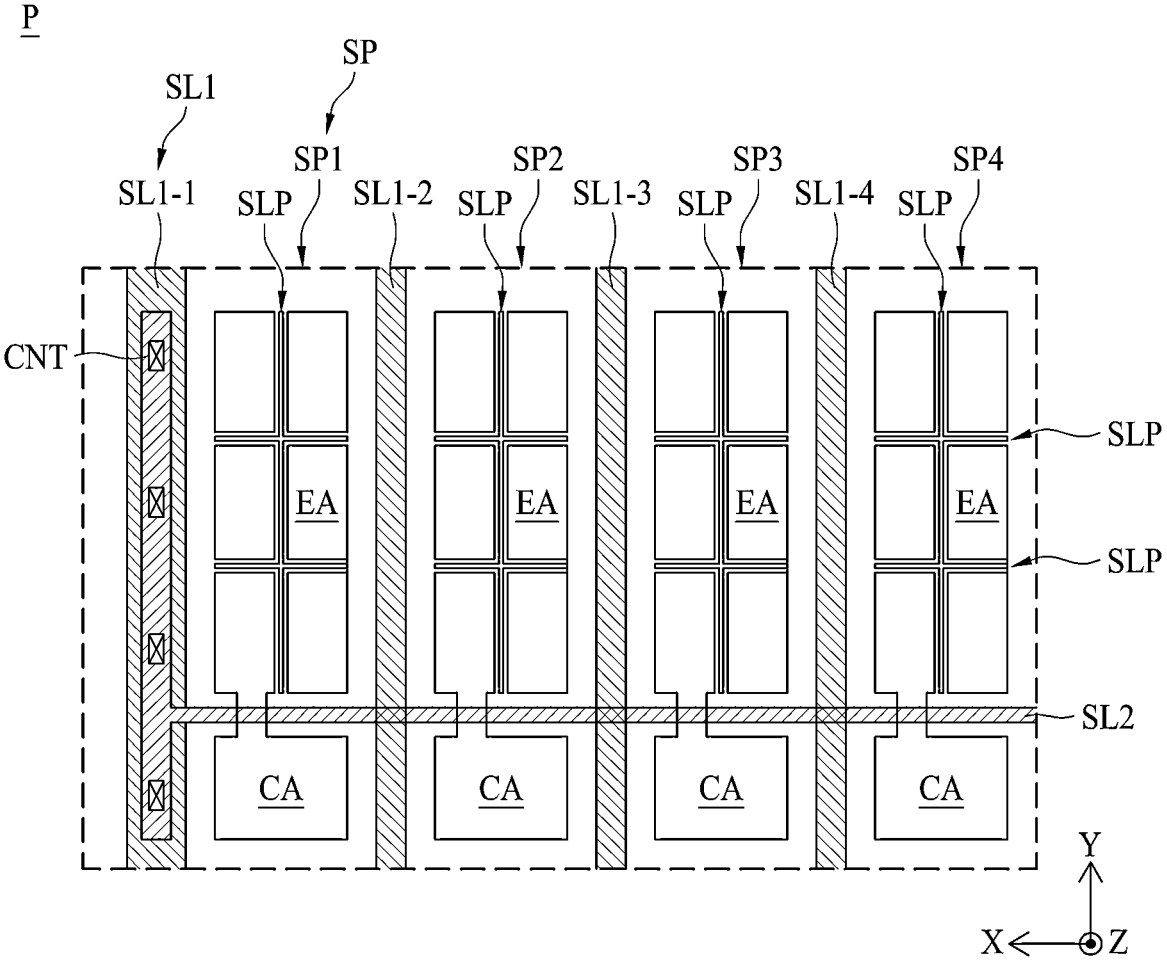

FIGS. 11A and 11B are plan views illustrating various modification embodiments of the display apparatus according to the second embodiment of the present disclosure.

FIG. 11A is a plan view illustrating an example where a plurality of slit portions SLP divide a protrusion portion PTP in a second direction (an X-axis direction) in one subpixel SP, and FIG. 11B is a plan view illustrating an example where a plurality of slit portions SLP divide a protrusion portion PTP in a first direction (a Y-axis direction) and a second direction (an X-axis direction) in one subpixel SP. As illustrated in FIGS. 6 and 11A, in the display apparatus of FIG. 6, one slit portion SLP may divide a protrusion portion PTP in a first direction (a Y-axis direction) in one subpixel SP, and thus, the protrusion portion PTP may be divided into two portions and disposed in one subpixel SP.

On the other hand, in the display apparatus of FIG. 11A, two slit portions SLP may divide a protrusion portion PTP in a second direction (an X-axis direction) in one subpixel SP, and thus, the protrusion portion PTP may be divided into three portions and disposed in one subpixel SP. In the display apparatus of FIG. 11A, a size (or an area) of an emission region EA (or a protrusion portion PTP) included in one subpixel SP may be set to be less than the display apparatus of FIG. 6. Accordingly, in the display apparatus of FIG. 11A, more emission regions EA (or protrusion portions PTP) may be disposed in one subpixel SP than the display apparatus of FIG. 6. As described above with reference to FIG. 10, as the number of emission regions EA disposed in one subpixel SP increases, a light efficiency increase rate may more increase. Therefore, in the display apparatus of FIG. 11A, more emission regions EA (or protrusion portions PTP) may be disposed in one subpixel SP than the display apparatus of FIG. 6, and thus, an area where a reflection portion 117 reflects lateral light between emission regions EA (or protrusion portions PTP) may more increase, thereby more enhancing forward light efficiency.

With reference to FIGS. 11A and 11B, in the display apparatus of FIG. 11B, three slit portions SLP may divide a protrusion portion PTP in a first direction (a Y-axis direction) and a second direction (an X-axis direction) in one subpixel SP, and thus, the protrusion portion PTP may be divided into six portions and disposed in one subpixel SP. In the display apparatus of FIG. 11B, a size (or an area) of an emission region EA (or a protrusion portion PTP) included in one subpixel SP may be set to be less than the display apparatus of FIG. 11A. Accordingly, in the display apparatus of FIG. 11B, more emission regions EA (or protrusion portions PTP) may be disposed in one subpixel SP than the display apparatus of FIG. 11A. Therefore, in the display apparatus of FIG. 11B, an area where a reflection portion 117 reflects lateral light between emission regions EA (or protrusion portions PTP) may more increase than the display apparatus of FIG. 11A, thereby more enhancing forward light efficiency.

However, when a protrusion portion PTP in one subpixel SP is far more divided by a plurality of slit portions SLP, a light loss rate caused by a dead zone of the slit portion SLP may more increase than an increase in reflection efficiency of lateral light by the reflection portion 117. Accordingly, a size (or number) of each of emission regions EA (or protrusion portions PTP) divided by a slit portion SLP in one subpixel SP may be adjusted within a range where an increase in reflection efficiency of lateral light by the reflection portion 117 is greater than a light loss rate by a dead zone of the slit portion SLP.

Figure 12:
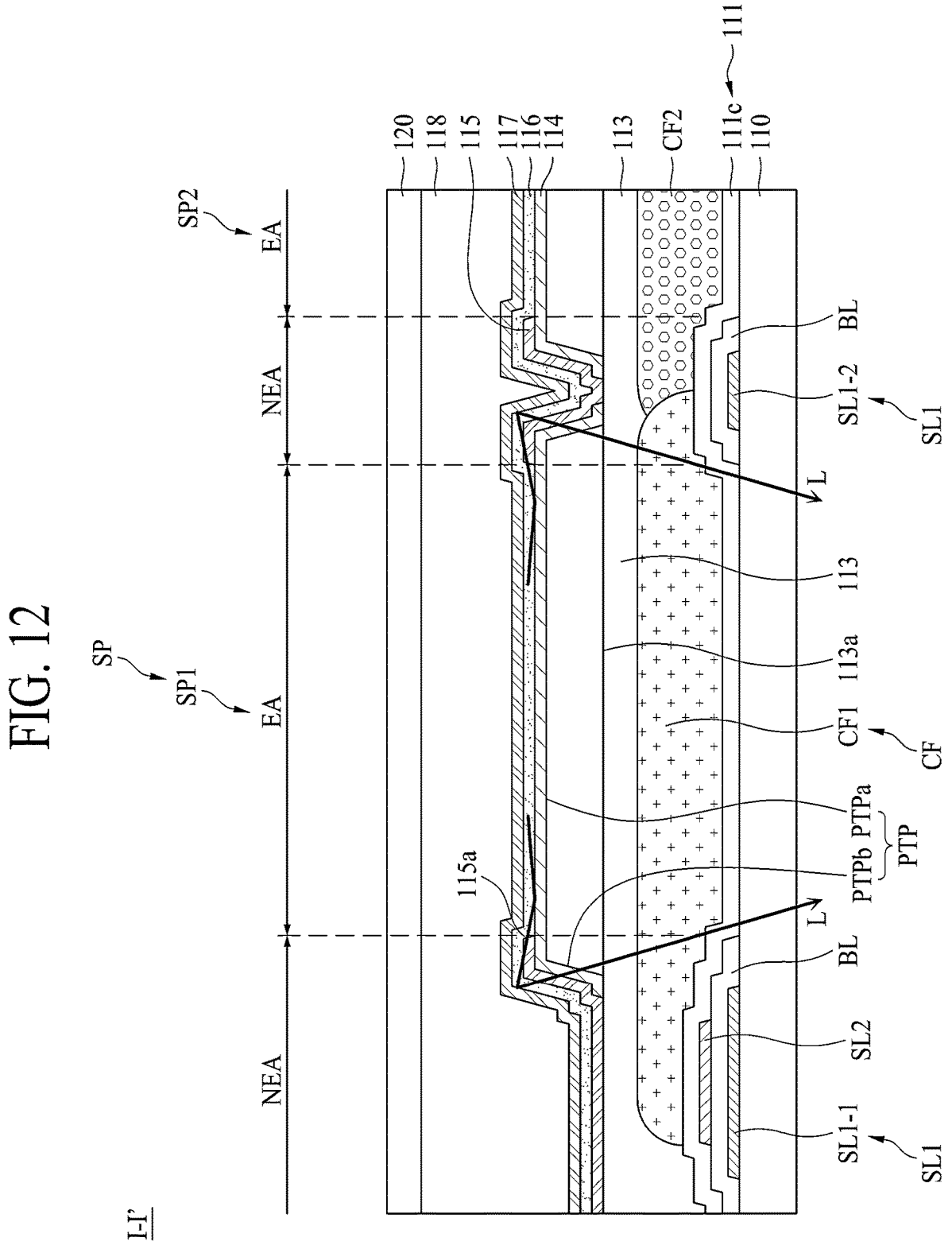
FIG. 12 is a schematic cross-sectional view of a display apparatus according to a third embodiment of the present disclosure.

FIG. 12 is a schematic cross-sectional view of a display apparatus 100 according to a third embodiment of the present disclosure.

As illustrated in FIG. 12, except for that a structure of a first layer BL is modified, the display apparatus 100 according to the third embodiment of the present disclosure may be the same as the display apparatus of FIG. 1 described above. Hereinafter, therefore, like reference numerals refer to like elements, and only different elements will be described.

With reference to FIGS. 3 and 12, in the display apparatus of FIG. 1 described above, a second layer 111c may be disposed on a first layer BL in an emission region EA, and thus, the penetration of external water into an organic emission layer 116 through a first substrate 110 may be doubly prevented.

On the other hand, in the display apparatus of FIG. 12, the first layer BL may be provided not to overlap an anode electrode 114 which is not covered by an insulation layer 115. Here, the anode electrode 114 which is not covered by the insulation layer 115 may denote an anode electrode 114 in the emission region EA. Therefore, the first layer BL may be removed not to overlap the emission region EA. Therefore, as illustrated in FIG. 12, a second layer 111c may directly contact an upper surface of the first substrate 110 in the emission region EA. In the display apparatus of FIG. 12, the first layer BL may be removed not to overlap the emission region EA, and thus, light loss caused by interface reflection may be prevented compared to a case where the first layer BL is in the emission region EA. This may denote that a transmittance of light irradiated toward the first substrate 110 is enhanced in the emission region EA.

A portion overlapping the emission region EA may be removed together in forming a contact hole connecting a first line SL1 with a second line SL2, and thus, the first layer BL may not overlap the emission region EA.

As a result, in the display apparatus 100 according to the third embodiment of the present disclosure, the first layer BL may be removed so that a layer overlapping the emission region EA is minimized, and thus, light loss caused by interface reflection of the first layer BL and the second layer 111c may be prevented and a light transmittance may be enhanced, thereby enhancing light efficiency.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
a substrate having a plurality of subpixels defined thereon;
a planarization layer on the substrate;
a protrusion portion on the planarization layer, the protrusion portion including an upper surface and a lateral surface;
a reflection portion on the lateral surface of the protrusion portion;
an anode electrode between the protrusion portion and the reflection portion;
an organic emission layer between the anode electrode and the reflection portion;
an insulation layer between the anode electrode and the organic emission layer;
a first line adjacent to one of the plurality of subpixels; and
a second line connected with the first line and arranged in a direction different from a direction of the first line,
wherein the planarization layer is made of an organic material,
wherein the protrusion portion is made of the same material as the planarization layer
wherein a width of the first line is less than or equal to a width of the insulation layer between the plurality of subpixels.

2. The display apparatus of claim 1, wherein each of the plurality of subpixels comprises an emission region and a circuit region adjacent to the emission region,
wherein the protrusion portion includes a plurality of protrusion portions with each protrusion portion in the emission region of a respective one of the subpixels, and
wherein the reflection portion is in the emission region and the circuit region of the plurality of subpixels.

3. The display apparatus of claim 1, wherein the reflection portion is on the upper surface of the protrusion portion, and is commonly disposed on the protrusion portion in each of the plurality of subpixels.

4. The display apparatus of claim 1,
wherein the reflection portion contacts an upper surface of the organic emission layer on the upper surface of the protrusion portion, and
wherein the anode electrode contacts a lower surface of the organic emission layer on the upper surface of the protrusion portion.

5. The display apparatus of claim 4, wherein the insulation layer is between the anode electrode and the reflection portion on the lateral surface of the protrusion portion.

6. The display apparatus of claim 5, wherein the anode electrode is on the upper surface and the lateral surface of the protrusion portion, the insulation layer covers the anode electrode on the lateral surface of the protrusion portion and extends up to the anode electrode on the upper surface of the protrusion portion, and one end of the insulation layer is disposed on the upper surface of the protrusion portion.

7. The display apparatus of claim 5, wherein the insulation layer comprises an inorganic material.

8. The display apparatus of claim 1, further comprising a plurality of color filters between the substrate and the planarization layer, wherein the plurality of color filters overlap partially at boundary portions between the plurality of subpixels.

9. The display apparatus of claim 1, wherein an angle between the lateral surface of the protrusion portion and an upper surface of the planarization layer contacting the protrusion portion is 30 degrees or more and less than 90 degrees.

10. The display apparatus of claim 1, further comprising a slit portion dividing the protrusion portion into two or more portions.

11. The display apparatus of claim 10, wherein the anode electrode and the reflection portion extend up to the upper surface of the protrusion portion and the slit portion.

12. The display apparatus of claim 11, wherein the insulation layer partially covers the anode electrode, wherein the protrusion portion comprises an inner surface in the slit portion, and wherein the insulation layer is between the anode electrode and the reflection portion on the inner surface of the protrusion portion.

13. The display apparatus of claim 12, wherein an angle between the inner surface of the protrusion portion and an upper surface of the planarization layer contacting the protrusion portion is 60 degrees or more and less than 90 degrees.

14. The display apparatus of claim 12, wherein the insulation layer is absent on the upper surface of the protrusion portion.

15. The display apparatus of claim 11, wherein the protrusion portion comprises a plurality of inner surfaces apart from one another in the slit portion, wherein the anode electrode contacts the planarization layer between the plurality of inner surfaces.

16. The display apparatus of claim 15, wherein the organic emission layer contacts each of the reflection portion and the anode electrode contacting the planarization layer, in the slit portion.

17. The display apparatus of claim 1, further comprising:

a first layer covering the first line;

a second layer covering the second line on the first layer, wherein the insulation layer covers an edge of the anode electrode, and wherein the first layer is non-overlapping the anode electrode at a portion of the anode electrode that is uncovered by the insulation layer.

18. The display apparatus of claim 1, wherein an angle between the upper surface of the protrusion portion and the lateral surface of the protrusion portion is an obtuse angle.

19. A display apparatus, comprising:

a substrate having a plurality of subpixels defined thereon;

a planarization layer on the substrate;

a protrusion portion on the planarization layer, the protrusion portion including an upper surface and a lateral surface;

an anode electrode on the upper surface and the lateral surface of the protrusion portion;

a reflection portion on the anode electrode;

an organic emission layer between the anode electrode and the reflection portion;

an insulation layer between the an organic emission layer and the anode electrode on the lateral surface of the protrusion portion;

a first line adjacent to one of the plurality of subpixels; and a second line connected with the first line and arranged in a direction different from a direction of the first line, wherein the planarization layer is made of an organic material, wherein the protrusion portion is made of the same material as the planarization layer, wherein a width of the first line is less than or equal to a width of the insulation layer between the plurality of subpixels.

20. The display apparatus of claim 19, wherein one end of the insulation layer is on the upper surface of the protrusion portion, and wherein an angle between the lateral surface of the protrusion portion and an upper surface of the planarization layer contacting the protrusion portion is 30 degrees or more, and less than 90 degrees.

21. The display apparatus of claim 19, further comprising a slit portion dividing the protrusion portion into two or more portions, wherein the protrusion portion comprises a plurality of inner surfaces apart from one another in the slit portion, and wherein the insulation layer is disposed between the anode electrode and the reflection portion, on the inner surface of the protrusion portion.

22. The display apparatus of claim 21, wherein the insulation layer is absent on the upper surface of the protrusion portion, and wherein an angle between the inner surface of the protrusion portion and an upper surface of the planarization layer contacting the protrusion portion is 60 degrees or more and less than 90 degrees.

* * * * *